United States Patent
Ihara

(10) Patent No.: US 10,424,611 B2
(45) Date of Patent: Sep. 24, 2019

(54) IMAGE SENSOR INCLUDING FIRST AND SECOND OVERLAPPING DEVICE ISOLATION PATTERNS

(71) Applicant: Samsung Electronics Co., Ltd., Suwon-si (KR)

(72) Inventor: Hisanori Ihara, Seongnam-si (KR)

(73) Assignee: SAMSUNG ELECTRONICS CO., LTD., Yeongtong-gu, Suwon-si, Gyeonggi-do (KR)

( * ) Notice: Subject to any disclaimer, the term of this patent is extended or adjusted under 35 U.S.C. 154(b) by 33 days.

(21) Appl. No.: 15/404,585

(22) Filed: Jan. 12, 2017

(65) Prior Publication Data

US 2017/0200757 A1 Jul. 13, 2017

(30) Foreign Application Priority Data

Jan. 12, 2016 (KR) .................. 10-2016-0003639

(51) Int. Cl.
*H01L 27/148* (2006.01)
*H01L 27/146* (2006.01)

(52) U.S. Cl.
CPC .... *H01L 27/14634* (2013.01); *H01L 27/1463* (2013.01); *H01L 27/14612* (2013.01); *H01L 27/14621* (2013.01); *H01L 27/14627* (2013.01); *H01L 27/14636* (2013.01); *H01L 27/14643* (2013.01); *H01L 27/14868* (2013.01)

(58) Field of Classification Search
CPC ......... H01L 27/14634; H01L 27/14636; H01L 27/1463; H01L 27/14627; H01L 27/14643
See application file for complete search history.

(56) References Cited

U.S. PATENT DOCUMENTS

| | | | |
|---|---|---|---|
| 5,990,516 A | * | 11/1999 | Momose ............. H01L 21/2255 257/327 |
| 7,781,716 B2 | | 8/2010 | Anderson et al. |
| 8,637,910 B2 | | 1/2014 | Koo et al. |
| 8,716,769 B2 | | 5/2014 | Ihara et al. |
| 8,823,070 B2 | | 9/2014 | Hisanori |
| 8,987,751 B2 | | 3/2015 | Ihara |
| 9,305,947 B2 | | 4/2016 | Ihara |
| 9,337,224 B2 | | 5/2016 | Ihara |
| 2006/0043525 A1 | * | 3/2006 | Mouli ................. H01L 27/1463 257/520 |
| 2010/0193848 A1 | | 8/2010 | Lee |

(Continued)

FOREIGN PATENT DOCUMENTS

| | | |
|---|---|---|
| CN | 104882460 A | 9/2015 |
| KR | 10-0850289 B1 | 8/2008 |

(Continued)

*Primary Examiner* — Matthew E. Gordon
(74) *Attorney, Agent, or Firm* — Muir Patent Law, PLLC

(57) ABSTRACT

An image sensor includes a lower substrate including logic circuits and an upper substrate including pixels. Transistors provided on the upper substrate have the same conductivity type. Each of the transistors includes source/drain regions provided in the upper substrate, an upper gate electrode provided on the upper substrate, and a silicon oxide layer disposed between the upper substrate and the upper gate electrode. The silicon oxide layer is in physical contact with the upper substrate and the upper gate electrode.

11 Claims, 22 Drawing Sheets

(56) References Cited

U.S. PATENT DOCUMENTS

| | | | |
|---|---|---|---|
| 2011/0157445 A1* | 6/2011 | Itonaga | H01L 21/76898 |
| | | | 348/308 |
| 2012/0223738 A1 | 9/2012 | Or-Bach et al. | |
| 2013/0321680 A1* | 12/2013 | Kumano | H01L 27/1464 |
| | | | 348/273 |
| 2014/0042299 A1 | 2/2014 | Wan et al. | |
| 2014/0077057 A1 | 3/2014 | Chao et al. | |
| 2014/0320718 A1 | 10/2014 | Fan | |
| 2015/0069523 A1 | 3/2015 | Or-Bach et al. | |
| 2015/0084098 A1 | 3/2015 | Choi et al. | |
| 2015/0364522 A1* | 12/2015 | Itahashi | H01L 27/14689 |
| | | | 438/59 |

FOREIGN PATENT DOCUMENTS

| | | |
|---|---|---|
| KR | 10-2008-0085798 A | 9/2008 |
| KR | 10-2015-0101681 A | 9/2015 |

\* cited by examiner

US 10,424,611 B2

IMAGE SENSOR INCLUDING FIRST AND SECOND OVERLAPPING DEVICE ISOLATION PATTERNS

CROSS-REFERENCE TO RELATED APPLICATION

This U.S. non-provisional patent application claims priority under 35 U.S.C. § 119 to Korean Patent Application No. 10-2016-0003639, filed on Jan. 12, 2016, in the Korean Intellectual Property Office, the disclosure of which is hereby incorporated by reference in its entirety.

BACKGROUND

The present disclosure relates to image sensors and, for example, to image sensors having a stack structure.

Image sensors are semiconductor devices converting an optical image into electrical signals. Image sensors may be one of charge coupled device (CCD) image sensors and complementary metal-oxide-semiconductor (CMOS) image sensors. The CMOS image sensor (CIS) may include a plurality of two-dimensionally arranged pixels. Each of the pixels may include a photodiode (PD). The photodiode may convert incident light into an electrical signal. As semiconductor devices have been highly integrated, highly integrated image sensors have been increasingly demanded.

SUMMARY

Embodiments of the inventive concepts may provide image sensors capable of simplifying manufacturing processes.

Embodiments of the inventive concepts may also provide highly integrated image sensors.

In an aspect, an image sensor may include a lower substrate including logic circuits, an interconnection layer provided on the lower substrate and electrically connected to the logic circuits, and an upper substrate provided on the interconnection layer, the upper substrate having pixels. The upper substrate may have a first surface and a second surface opposite to each other, the first surface so configured that light comes through the first surface into the image sensor. All of the transistors provided on the upper substrate may be the same conductivity type transistors. Each of the transistors may include source/drain regions provided in the upper substrate, an upper gate electrode provided on the upper substrate, and a silicon oxide layer disposed between the upper substrate and the upper gate electrode and being in contact with the upper substrate and the upper gate electrode.

In an aspect, an image sensor may include a lower substrate, source/drain portions provided in the lower substrate, a lower gate electrode provided on the lower substrate, a silicon oxide pattern disposed between the lower substrate and the lower gate electrode, a silicon nitride pattern disposed between the silicon oxide pattern and the lower gate electrode, an interconnection layer covering the lower substrate, an upper substrate provided on the interconnection layer, the upper substrate including pixels and photoelectric conversion regions provided in the pixels, source/drain regions provided in the upper substrate, an upper gate electrode disposed on the upper substrate, and a silicon oxide layer disposed between the upper substrate and the upper gate electrode and being in contact with the upper substrate and the upper gate electrode.

In an aspect, an image sensor may include a lower substrate including a P-type lower transistor and an N-type lower transistor, an upper substrate stacked on the lower substrate, the upper substrate including a plurality of pixels, and an interconnection layer provided between the lower substrate and the upper substrate. Each of upper transistors included in the upper substrate may be an NMOS transistor. Each of the upper transistors may include source/drain regions in the upper substrate, a gate electrode on one surface of the upper substrate, and a silicon oxide layer provided between the gate electrode and the upper substrate. The silicon oxide layer may be in contact with the gate electrode and the upper substrate.

In an aspect of the disclosure, an image sensor comprises a lower substrate provided with a plurality of first transistors forming a logic circuit, an upper substrate provided with a plurality of pixels sensing light intensity coming from outside, and an interconnection layer disposed between the lower substrate and the upper substrate, the interconnection layer including a plurality of conductive patterns electrically connecting the pixels of the upper substrate and the first transistors of the lower substrate, wherein each of the plurality of pixels comprises a plurality of second transistors and a photoelectric conversion region, wherein the photoelectric conversion region is configured to change light energy into electric signals, wherein all of the second transistors of each pixel are NMOS transistors, wherein the second transistors are configured to transfer the electric signals to the logic circuit of the lower substrate, wherein each of the second transistors comprises a gate electrode formed on the upper substrate, source/drain regions formed on both sides of the gate electrode, a channel region formed between the source/drain regions, and a silicon oxide pattern between the channel region and the gate electrode, wherein the silicon oxide pattern contacts the gate electrode and the channel region.

In an aspect of the disclosure, an image sensor comprises a lower substrate provided with a plurality of first transistors forming a logic circuit, an upper substrate provided with a plurality of pixels sensing light intensity coming from outside, and an interconnection layer disposed between the lower substrate and the upper substrate, the interconnection layer including a plurality of conductive patterns electrically connecting the pixels of the upper substrate and the first transistors of the lower substrate, wherein each of the plurality of pixels comprises a plurality of second transistors and a photoelectric conversion region, wherein the photoelectric conversion region is configured to change light energy into electric signals, wherein the second transistors are configured to transfer the electric signals to the logic circuit of the lower substrate, wherein the upper substrate comprises an isolation pattern between the pixels, wherein a width of the top surface of the isolation pattern is greater than a width of the bottom surface of the isolation pattern.

In an aspect of the disclosure, an image sensor comprises a lower substrate provided with a plurality of first transistors forming a logic circuit, an upper substrate provided with a plurality of pixels sensing light intensity coming from outside, and an interconnection layer disposed between the lower substrate and the upper substrate, the interconnection layer including a plurality of conductive patterns electrically connecting the pixels of the upper substrate and the first transistors of the lower substrate, wherein each of the plurality of pixels comprises a plurality of second transistors and a photoelectric conversion region, wherein the photoelectric conversion region is configured to change light energy into electric signals, wherein the second transistors are configured to transfer the electric signals to the logic circuit of the lower substrate, wherein the upper substrate comprises an isolation pattern between the pixels, wherein a width of the bottom surface of the isolation pattern is greater than a width of the top surface of the isolation pattern.

BRIEF DESCRIPTION OF THE DRAWINGS

Aspects of the inventive concepts will become more apparent in view of the attached drawings and accompanying detailed description.

DETAILED DESCRIPTION

Figure 1:
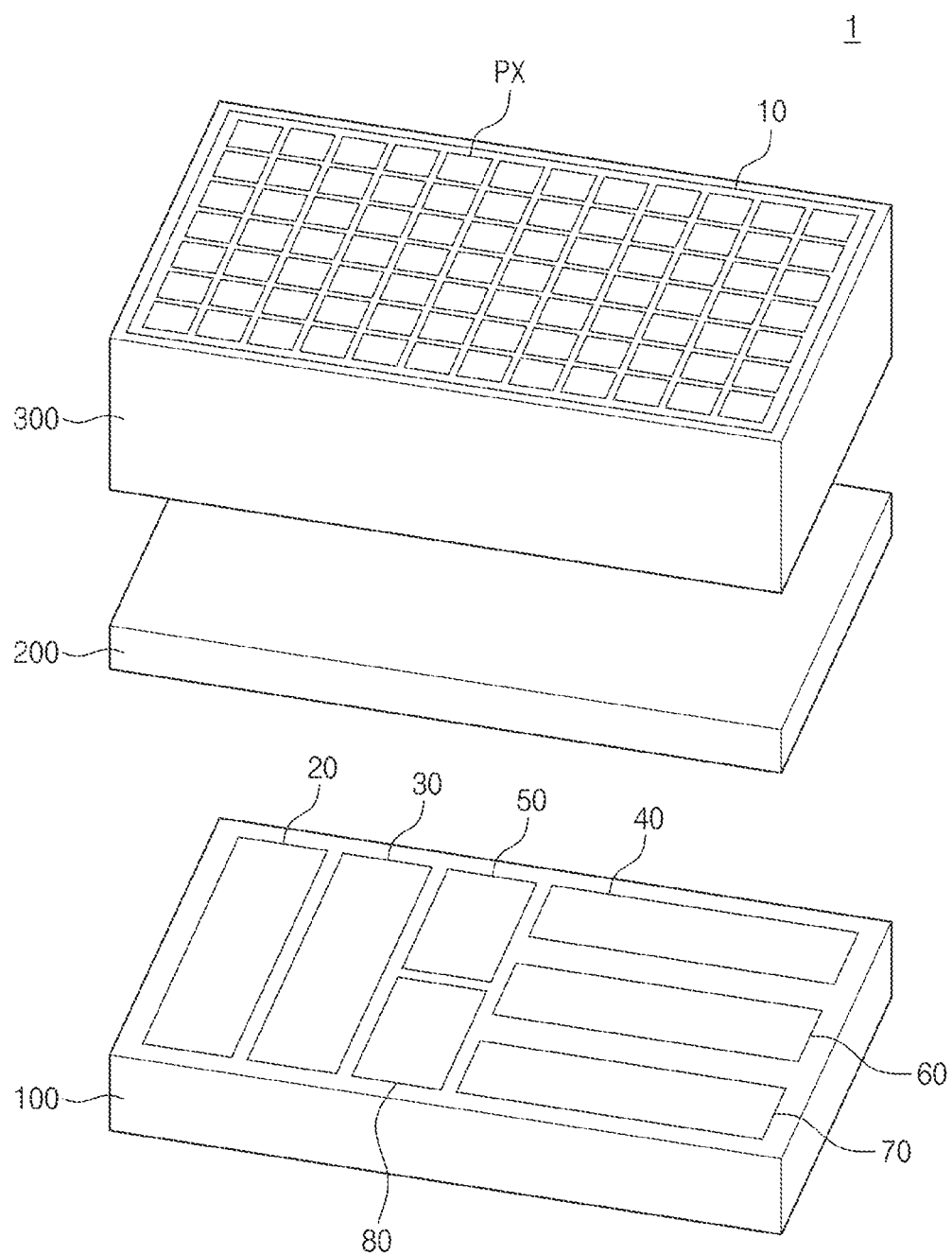
FIG. 1 is a schematic block diagram illustrating an image sensor according to some embodiments of the inventive concepts.

The present disclosure now will be described more fully hereinafter with reference to the accompanying drawings, in which various embodiments are shown. The invention may, however, be embodied in many different forms and should not be construed as limited to the example embodiments set forth herein. These example embodiments are just that—examples—and many implementations and variations are possible that do not require the details provided herein. It should also be emphasized that the disclosure provides details of alternative examples, but such listing of alternatives is not exhaustive. Furthermore, any consistency of detail between various examples should not be interpreted as requiring such detail—it is impracticable to list every possible variation for every feature described herein. The language of the claims should be referenced in determining the requirements of the invention.

In the drawings, the size and relative sizes of layers and regions may be exaggerated for clarity. Like numbers refer to like elements throughout. Though the different figures show variations of exemplary embodiments, these figures are not necessarily intended to be mutually exclusive from each other. Rather, as will be seen from the context of the detailed description below, certain features depicted and described in different figures can be combined with other features from other figures to result in various embodiments, when taking the figures and their description as a whole into consideration.

Although the figures described herein may be referred to using language such as "one embodiment," or "certain embodiments," these figures, and their corresponding descriptions are not intended to be mutually exclusive from other figures or descriptions, unless the context so indicates. Therefore, certain aspects from certain figures may be the same as certain features in other figures, and/or certain figures may be different representations or different portions of a particular exemplary embodiment.

It will be understood that, although the terms first, second, third etc. may be used herein to describe various elements, components, regions, layers and/or sections, these elements, components, regions, layers and/or sections should not be limited by these terms. Unless the context indicates otherwise, these terms are only used to distinguish one element, component, region, layer or section from another element, component, region, layer or section, for example as a naming convention. Thus, a first element, component, region, layer or section discussed below in one section of the specification could be termed a second element, component, region, layer or section in another section of the specification or in the claims without departing from the teachings of the present invention. In addition, in certain cases, even if a term is not described using "first," "second," etc., in the specification, it may still be referred to as "first" or "second" in a claim in order to distinguish different claimed elements from each other.

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.). The term "contact," as used herein, refers to a direct connection (i.e., touching) unless the context indicates otherwise.

Embodiments described herein will be described referring to plan views and/or cross-sectional views by way of ideal schematic views. Accordingly, the exemplary views may be modified depending on manufacturing technologies and/or tolerances. Therefore, the disclosed embodiments are not limited to those shown in the views, but include modifications in configuration formed on the basis of manufacturing processes. Therefore, regions exemplified in figures may have schematic properties, and shapes of regions shown in figures may exemplify specific shapes of regions of elements to which aspects of the invention are not limited.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

Also these spatially relative terms such as "above" and "below" as used herein have their ordinary broad meanings—for example element A can be above element B even if when looking down on the two elements there is no overlap between them (just as something in the sky is generally above something on the ground, even if it is not directly above).

Terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," or "substantially planar," may be exactly the same, equal, or planar, or may be the same, equal, or planar within acceptable variations that may occur, for example, due to manufacturing processes.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

As used herein, items described as being "electrically connected" are configured such that an electrical signal can be passed from one item to the other. Therefore, a passive electrically conductive component (e.g., a wire, pad, internal electrical line, etc.) physically connected to a passive electrically insulative component (e.g., a prepreg layer of a printed circuit board, an electrically insulative adhesive connecting two device, an electrically insulative underfill or mold layer, etc.) is not electrically connected to that component. Moreover, items that are "directly electrically connected," to each other are electrically connected through one or more passive elements, such as, for example, wires, pads, internal electrical lines, through vias, etc. As such, directly electrically connected components do not include components electrically connected through active elements, such as transistors or diodes. Directly electrically connected elements may be directly physically connected and directly electrically connected.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

FIG. 1 is a schematic block diagram illustrating an image sensor according to some embodiments of the inventive concepts.

Referring to FIG. 1, an image sensor 1 may include a lower substrate 100 and an upper substrate 300 stacked on the lower substrate 100. An interconnection layer 200 may be disposed between the lower substrate 100 and the upper substrate 300.

The upper substrate 300 may include a pixel sensor array 10 and may sense an image. The pixel sensor array 10 may include a plurality of two-dimensionally arranged pixels PX and may convert optical signals into electrical signals. The upper substrate 300 may include upper transistors Tx, Sx, Rx, and Ax that may correspond to image-sensing transistors. The upper transistors Tx, Sx, Rx, and Ax may have the same conductivity type. Transistors having the same conductivity type may have channels having the same conductivity type or may have source/drains having the same conductivity type. For example, certain transistors may be same conductivity-type transistors (e.g., all NMOS, or alternatively, all PMOS). In some embodiments, the upper transistors Tx, Sx, Rx, and Ax may be NMOS transistors. In certain embodiments, the upper transistors Tx, Sx, Rx, and Ax may be PMOS transistors. In some embodiments, the upper substrate 300 may not include a logic transistor or CMOS transistors.

The lower substrate 100 may include a row decoder 20, a row driver 30, a column decoder 40, a timing generator 50, a correlated double sampler (CDS) 60, an analog-to-digital converter (ADC) 70, and an input/output (I/O) buffer 80. FIG. 1 is a functional block diagram illustrating logic circuits (e.g., the row decoder 20, the row driver 30, the column decoder 40, the timing generator 50, the correlated double sampler (CDS) 60, the analog-to-digital converter (ADC) 70, and the I/O buffer 80) of the lower substrate 100. However, embodiments of the inventive concepts are not limited to the arrangement of the logic circuits of the lower substrate 100 illustrated in FIG. 1.

The row driver 30 may provide a plurality of driving signals for driving the pixels PX to the pixel sensor array 10 of the upper substrate 300 through the interconnection layer 200 in response to signals decoded in the row decoder 20. The driving signals may include a selection signal, a reset signal, and/or a charge transfer signal. When the pixels PX are arranged in a matrix form, the driving signals may be provided to each row of the matrix. The timing generator 50 may provide timing signals and control signals to the row decoder 20 and the column decoder 40.

The correlated double sampler 60 may receive an electrical signal generated from the pixel sensor array 10 and may hold and sample the received electrical signal. The correlated double sampler 60 may sample a specific noise level and a signal level of the electrical signal to output a level corresponding to a difference between the noise level and the signal level. For example, the correlated double sampler 60 may output a signal for which noise is removed. The electrical signal generated from the upper substrate 300 may be provided to the correlated double sampler 60 of the lower substrate 100 through the interconnection layer 200.

The analog-to-digital converter 70 may convert an analog signal that corresponds to the level outputted from the correlated double sampler 60, into a digital signal. The I/O buffer 80 may latch the digital signals and may sequentially output the latched digital signals to an image signal processing part (not shown) in response to signals decoded in the column decoder 40. The lower substrate 100 may include lower transistors (not shown) for realizing the functions, and the lower transistors may be logic transistors. The lower transistors may include transistors of which conductivity types are different from each other. For example, the lower transistors may include CMOS transistors.

Figure 2:
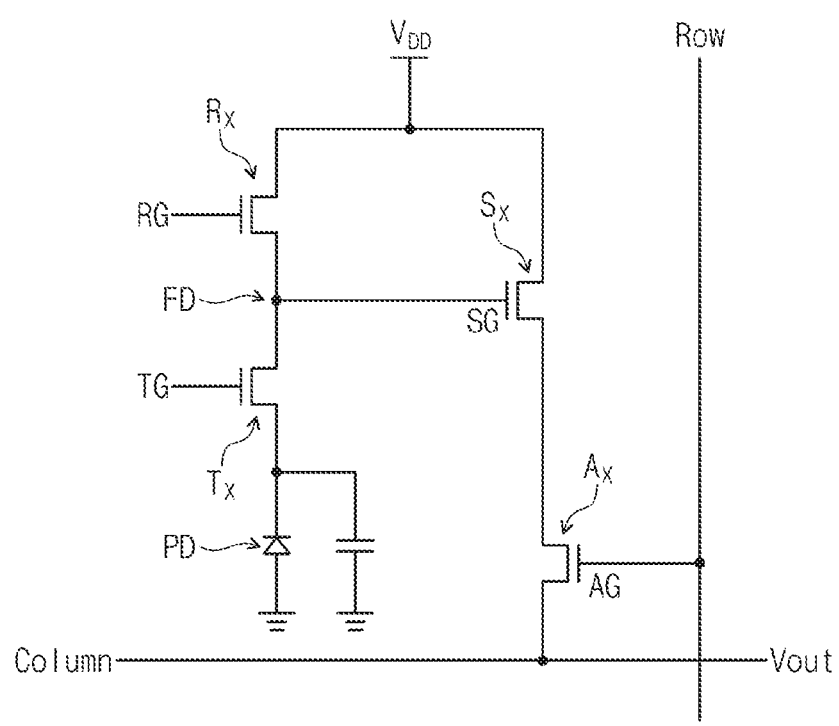
FIG. 2 is a circuit diagram illustrating a pixel of an image sensor according to some embodiments of the inventive concepts.

FIG. 2 is a circuit diagram illustrating a pixel of an image sensor according to some embodiments of the inventive concepts.

Referring to FIG. 2, each of pixels PX of an image sensor 1 may include a photoelectric conversion region PD, a transfer transistor Tx, a source follower transistor Sx, a reset transistor Rx, and a selection transistor Ax. The transfer transistor Tx, the source follower transistor Sx, the reset transistor Rx, and the selection transistor Ax may include a transfer gate electrode TG, a source follower gate electrode SG, a reset gate electrode RG, and a selection gate electrode AG, respectively. The photoelectric conversion region PD may be a photodiode including an N-type dopant region and a P-type dopant region. A drain of the transfer transistor Tx may be a floating diffusion region FD. The floating diffusion region FD may also be a source of the reset transistor Rx. The floating diffusion region FD may be electrically connected to the source follower gate electrode SG of the source follower transistor Sx. The source follower transistor Sx may be connected to the selection transistor Ax. The reset transistor Rx, the source follower transistor Sx, and the selection transistor Ax may be shared by neighboring pixels PX, and thus an integration density of the image sensor 1 may be improved.

A method of operating the image sensor 1 will be described hereinafter. First, a power voltage VDD may be applied to the drains of the reset transistor Rx and the source follower transistor Sx in a dark state, thereby discharging charges remaining in the floating diffusion region FD. Thereafter, the reset transistor Rx may be turned-off and light may be incident on the photoelectric conversion region PD to generate electron-hole pairs in the photoelectric conversion region PD. Holes may be moved into the P-type dopant region, and electrons may be moved into and accumulated in the N-type dopant region. The transfer transistor Tx may be turned-on, and thus charges (e.g., the electrons) may be transferred into the floating diffusion region FD. The transferred charges may be accumulated in the floating diffusion region FD. A gate bias of the source follower transistor Sx may be changed in proportion to the amount of the charges accumulated in the floating diffusion region FD, thereby causing a potential change of the source of the source follower transistor Sx. At this time, the selection transistor Ax may be turned-on, and thus a signal generated by the charges may be sensed through a column line.

Figure 3A:
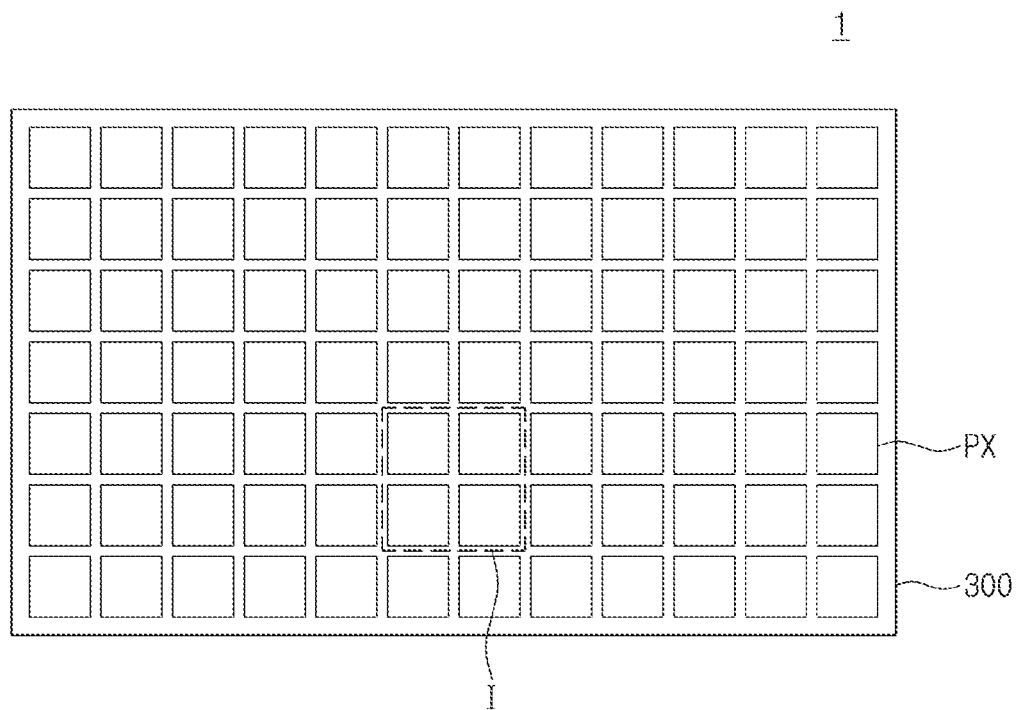
FIG. 3A is a plan view illustrating an image sensor according to some embodiments of the inventive concepts.
Figure 3B:
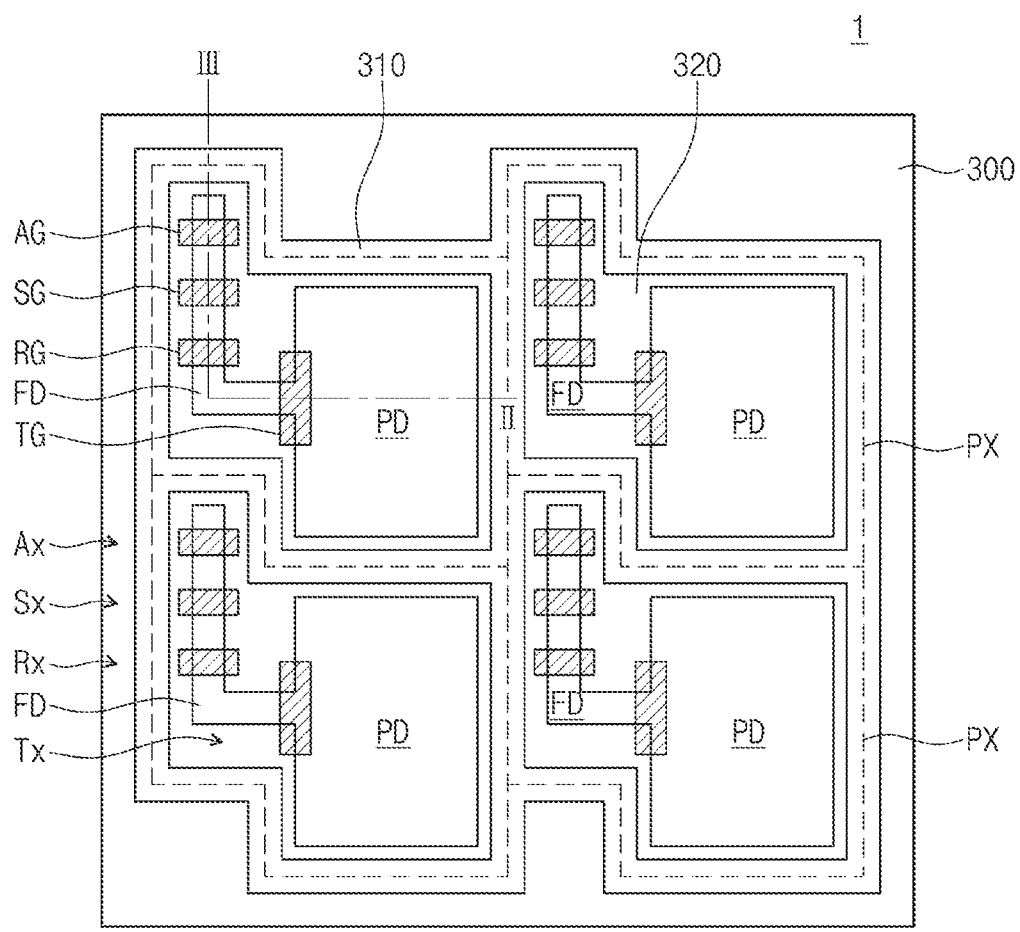
FIG. 3B is an enlarged view of a region 'I' of FIG. 3A to illustrate an image sensor according to some embodiments of the inventive concepts.
Figure 3C:
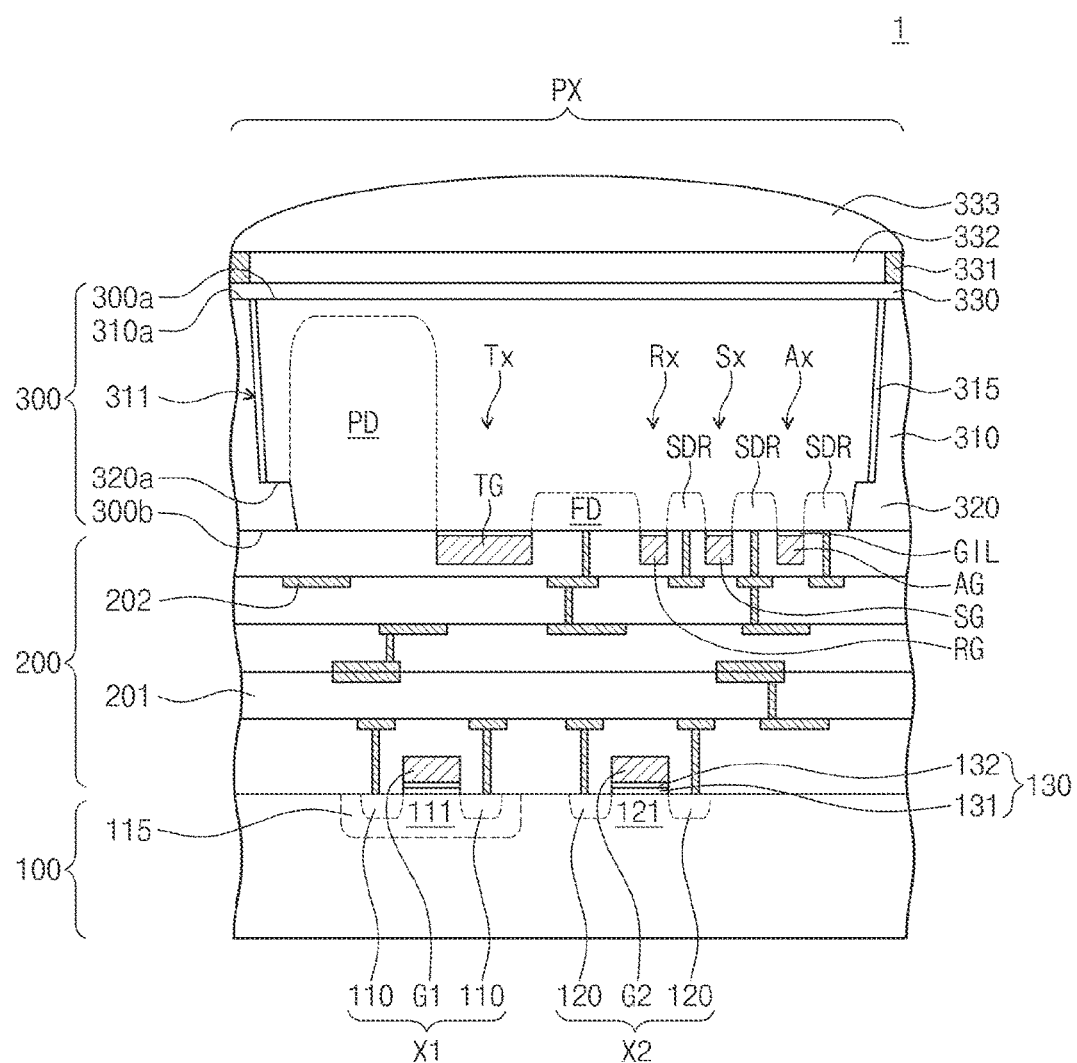
FIG. 3C is an exemplary cross-sectional view taken along a line II-III of FIG. 3B.

FIG. 3A is a plan view illustrating an image sensor according to some embodiments of the inventive concepts. FIG. 3B is an enlarged view of a region 'I' of FIG. 3A to illustrate an image sensor according to some embodiments of the inventive concepts. FIG. 3C is a cross-sectional view taken along a line II-III of FIG. 3B. Hereinafter, the descriptions to the same elements as mentioned above will be omitted or mentioned briefly for ease and convenience of explanation.

Referring to FIGS. 1, 2, and 3A to 3C, the image sensor 1 may include the lower substrate 100, the interconnection layer 200, and the upper substrate 300. The lower substrate 100 may include a semiconductor substrate or a silicon-on-insulator (SOI) substrate. The substrate 100 may be a substrate having a first conductivity type.

The lower substrate 100 may include a plurality of lower transistors X1 and X2. The lower transistors X1 and X2 may be logic transistors. As described with reference to FIG. 1, the lower transistors X1 and X2 may perform at least one of the functions of the row decoder 20, the row driver 30, the column decoder 40, the timing generator 50, the correlated double sampler 60, the analog-to-digital converter 70, and the I/O buffer 80.

The lower transistors X1 and X2 may include transistors of which conductivity types are different from each other. For example, the lower transistors X1 and X2 may include CMOS transistors. The lower transistors X1 and X2 may include a first lower transistor X1 of the first conductivity type and a second lower transistor X2 of a second conductivity type. For example, one of the first and second transistors X1 and X2 may be an N-type transistor (i.e., an N-channel transistor), and the other of the first and second transistors X1 and X2 may be a P-type transistor (i.e., a P-channel transistor). The first lower transistor X1 may include a first lower gate electrode G1 and first source/drain portions 110 disposed in the lower substrate 100. A first channel region 111 may be defined between the first source/drain portions 110 in the lower substrate 100. The first lower gate electrode G1 may be provided on the first channel region 111 of the lower substrate 100. The first lower gate electrode G1 and the first source/drain portions 110 may include dopants of the first conductivity type. A doped well region 115 may be provided in the lower substrate 100. The doped well region 115 may be doped with dopants of which a conductivity type (e.g., the second conductivity type) is different from that of the lower substrate 100. The first source/drain portions 110 of the first lower transistor X1 may be provided in the doped well region 115. The second lower transistor X2 may include a second lower gate electrode G2 and second source/drain portions 120 disposed in the lower substrate 100. A second channel region 121 may be defined between the second source/drain portions 120 in the lower substrate 100. The second lower gate electrode G2 may be provided on the second channel region 121 of the lower substrate 100. The second lower gate electrode G2 and the second source/drain portions 120 may include dopants of the second conductivity type. Gate insulating patterns 130 may be provided between the first lower gate electrode G1 and the lower substrate 100 and between the second lower gate electrode G2 and the lower substrate 100, respectively. The gate insulating pattern 130 may include a silicon oxide pattern 131 and a silicon nitride pattern 132. The silicon nitride pattern 132 may be disposed between the silicon oxide pattern 131 and each of the first and second lower gate electrodes G1 and G2.

One of the first and second lower gate electrodes G1 and G2 may include P-type dopants (e.g., boron (B)). Hereinafter, the first lower transistor X1 of the P-type transistor will be described as an example. However, embodiments of the inventive concepts are not limited thereto. When an atom size of the dopants is small, the dopants may easily migrate. For example, if the silicon nitride pattern 132 is omitted, boron (B) included in the first lower gate electrode G1 may penetrate the silicon oxide pattern 131 to migrate into the first channel region 111 in an operation of the image sensor 1. According to some embodiments of the inventive concepts, the silicon nitride pattern 132 may reduce or prevent the migration of boron (B), and thus threshold voltages of the lower transistors X1 and X2 may not be reduced (e.g. threshold voltages of the transistors may be kept in a proper range or a predetermined range). The gate insulating pattern 130 under the first lower gate electrode G1 and the gate insulating pattern 130 under the second lower gate electrode G2 may be formed by the same process. Thus, the silicon nitride pattern 132 may also be disposed between the second lower gate electrode G2 and the lower substrate 100.

The interconnection layer 200 may be disposed on the lower substrate 100. The interconnection layer 200 may include at least one insulating pattern 201 and conductive patterns 202. The conductive patterns 202 may be connected to the first source/drain portions 110 and/or the second source/drain portions 120. Even though not shown in the drawings, one or some of the conductive patterns 202 may be connected to the first lower gate electrode G1 and/or the second lower gate electrode G2.

The upper substrate 300 may be disposed on the interconnection layer 200. The upper substrate 300 may include a semiconductor substrate or a silicon-on-insulator (SOI) substrate. The upper substrate 300 may include dopants of which a conductivity type (e.g., the first conductivity type) is the same as that of the lower substrate 100.

The upper substrate 300 may include a plurality of pixels PX. Each of the pixels PX may include upper transistors Tx, Sx, Rx, and Ax. Each of the upper transistors Tx, Sx, Rx, and Ax may be an image-sensing transistor. For example, the upper transistors Tx, Sx, Rx, and Ax may be the transfer transistor Tx, the source follower transistor Sx, the reset transistor Rx, and the selection transistor Ax described with reference to FIG. 2. Since the lower substrate 100 includes the logic transistors, the logic transistors may not be provided on the upper substrate 300. The upper transistors Tx, Sx, Rx, and Ax may have the same conductivity type. For example, the upper transistors Tx, Sx, Rx, and Ax may be transistors of the second conductivity type, and transistors of the first conductivity type may not be formed on the upper substrate 300. Since in certain embodiments the transistors of the first conductivity type are not formed on the upper substrate 300, processes of forming the upper transistors Tx, Sx, Rx, and Ax may be simplified.

As illustrated in FIG. 3C, the upper substrate 300 may have a first surface 300a and a second surface 300b opposite to each other. The first surface 300a of the upper substrate 300 may be a back surface, and the second surface 300b of the upper substrate 300 may be a front surface. For example, most of the devices and/or circuits may be formed on the front surface 300b of the upper substrate 300.

A first device isolation pattern 310 may be provided in the upper substrate 300. The first device isolation pattern 310 may be a deep trench isolation pattern. For example, the first device isolation pattern 310 may include an insulating material and may be provided in a trench 311 recessed from the second surface 300b of the upper substrate 300. The first device isolation pattern 310 may include a material of which a refractive index is lower than that of the upper substrate 300. For example, the first device isolation pattern 310 may include an insulator pattern. For example, the device isolation pattern 310 may include at least one of silicon oxide, silicon nitride, or silicon oxynitride. The first device isolation pattern 310 may penetrate the upper substrate 300. Crosstalk between the pixels PX may be improved or prevented by the first device isolation pattern 310.

A doped isolation layer 315 may be provided on a sidewall of the first device isolation pattern 310. The doped isolation layer 315 may include dopants of the first conductivity type. For example, the doped isolation layer 315 may include P-type dopants. However, embodiments of the inventive concepts are not limited thereto. In certain embodiments, the doped isolation layer 315 may be omitted.

A second device isolation pattern 320 may be provided in the upper substrate 300 and may be adjacent to the second surface 300b of the upper substrate 300. As illustrated in FIG. 3B, the second device isolation pattern 320 may overlap with the first device isolation pattern 310 with respect to a plan view. The second device isolation pattern 320 may be connected to the first device isolation pattern 310. The second device isolation pattern 320 may be a shallow trench isolation pattern, and a depth of the second device isolation pattern 320 may be shallower than that of the first device isolation pattern 310. The second device isolation pattern 320 may include the same material as the first device isolation pattern 310. However, embodiments of the inventive concepts are not limited thereto. The second device isolation pattern 320 may laterally extend along the second surface 300b of the upper substrate 300. A sidewall of the second device isolation pattern 320 may be laterally offset from the sidewall of the first device isolation pattern 310. For example, the second device isolation pattern 320 may be wider than the first device isolation pattern 310 in a plan view. A top surface 320a of the second device isolation pattern 320 may be spaced apart from the first surface 300a of the upper substrate 300. A distance between the top surface 320a of the second device isolation pattern 320 and the second surface 300b of the upper substrate 300 may be smaller than a distance between a top surface 310a of the first device isolation pattern 310 and the second surface 300b of the upper substrate 300. For example, an interfacing surface between the first device isolation pattern 310 and the second device isolation pattern 320 may be closer to the second surface 300b than to the first surface 300a of the upper substrate 300. As illustrated in FIG. 3B, the second device isolation pattern 320 may define active regions. The transfer transistor Tx, the source follower transistor Sx, the reset transistor Rx, and the selection transistor Ax may be formed on each of the active regions. Each of the active regions may include a floating diffusion region FD and source/drain regions SDR as illustrated in FIG. 3C. The floating diffusion region FD and the source/drain regions SDR may be disposed in the upper substrate 300 and may be adjacent to the second surface 300b of the upper substrate 300. The floating diffusion region FD and the source/drain regions SDR may be regions doped with dopants of the second conductivity type. In some embodiments, the floating diffusion region FD and the source/drain regions SDR may be doped with N-type dopants.

A photoelectric conversion region PD may be provided in the upper substrate 300 of each of the pixels PX. The photoelectric conversion region PD may function and act as the photoelectric conversion region PD described with reference to FIG. 2. The photoelectric conversion region PD may comprise a first dopant region PD1 doped with the first conductivity type dopant and a second dopant region PD2 doped with the second conductivity type dopant.

A transfer gate electrode TG may be disposed on the upper substrate 300 of each of the pixels PX. A source follower gate electrode SG, a reset gate electrode RG, and a selection gate electrode AG may be disposed at a side of the transfer gate electrode TG on the upper substrate 300 of each of the pixels PX. For example, a source follower gate electrode SG, a reset gate electrode RG, and a selection gate electrode AG of a pixel may be disposed at one side of the transfer gate electrode TG, and a photoelectric conversion region PD of the pixel may be disposed at the other side of the transfer gate electrode TG as shown in FIG. 3C. The transfer gate electrode TG, the source follower gate electrode SG, the reset gate electrode RG, and the selection gate electrode AG may be disposed on the second surface 300b of the upper substrate 300 and may have flat-type structures. For example, each of the transfer gate electrode TG, the source follower gate electrode SG, the reset gate electrode RG, and the selection gate electrode AG may have the same thickness (e.g., in a vertical direction) throughout its width and may have a rectangular shape in a cross-sectional view. Each of the transfer gate electrode TG, the source follower gate electrode SG, the reset gate electrode RG, and the selection gate electrode AG may have the same thickness as each other (e.g., in a vertical direction) and may be disposed at the same height as each other. In one embodiment, top surfaces (e.g., surfaces adjacent to the upper substrate 300) of the gate electrodes TG, SG, RG, and AG may be disposed at a lower level than the second surface 300b of the upper substrate 300 and may be substantially parallel to the second surface 300b of the upper substrate 300. For example, the gate electrodes TG, SG, RG, and AG may extend downward toward the interconnection layer 200. For example, the gate electrodes TG, SG, RG, and AG may be embedded in the interconnection layer 200 as shown in FIG. 3C. The gate electrodes TG, SG, RG, and AG may include poly-silicon. The gate electrodes TG, SG, RG, and AG may include dopants. The dopants included in the gate electrodes TG, SG, RG, and AG may have the same conductivity type as the dopants included in the source/drain regions SDR. The dopants included in the gate electrodes TG, SG, RG, and AG may have the same conductivity type as the dopants included in one (e.g., the second lower gate electrode G2) of the first and second lower gate electrodes G1 and G2. An average atom size of the dopants included in the gate electrodes TG, SG, RG, and AG may be greater than that of the other (e.g., the first lower gate electrode G1) of the first and second lower gate electrodes G1 and G2. A gate insulating layer GIL may be disposed between the upper substrate 300 and each of the gate electrodes TG, SG, RG, and AG. The gate insulating layer GIL may include silicon oxide but may not include nitrogen. In the present specification, when it is described "that a component does not include a certain element/material," the component does not substantially include the certain element/material. For example, "that a component does not include a certain element/material" may mean to include a tolerance range of a process and may mean that a process of intentionally providing the certain element/material into the component is not performed. An additional silicon nitride layer (not shown) may or may not be disposed between the upper substrate 300 and each of the gate electrodes TG, SG, RG, and AG. For example, the gate insulating layers GIL may be in contact (e.g. physical contact) with the upper substrate 300 and the gate electrodes TG, SG, RG, and AG. When any one of the gate electrodes TG, SG, RG, and AG includes dopants having excellent mobility, an additional silicon nitride layer may be formed between the upper substrate 300 and the any one of the gate electrodes TG, SG, RG, and AG. In this case, a silicon nitride layer (not shown) may be disposed between the upper substrate 300 and each of the gate electrodes TG, SG, RG, and AG. In some embodiments, the gate electrodes TG, SG, RG, and AG may include dopants of which mobility is relatively low. For example, the gate electrodes TG, SG, RG, and AG may include arsenic (As) or phosphorus (P) (e.g., arsenic (As)), and the upper transistors Tx, Sx, Rx, and Ax may be NMOS transistors. In case an additional silicon nitride layer is not formed between the upper substrate 300 and the gate electrodes TG, SG, RG, and AG, processes of manufacturing the image sensor 1 may be simple. However, the dopants included in the gate electrodes TG, SG, RG, and AG are not limited to arsenic (As) or phosphorus (P). In certain embodiments, the gate electrodes TG, SG, RG, and AG may include P-type dopants of which mobility is low.

A buffer layer 330, color filters 332, and micro lenses 333 may be disposed on the first surface 300a of the upper substrate 300. A grid pattern 331 may be provided on the buffer layer 330. In certain embodiments, the grid pattern 331 may be omitted. The color filters 332 and the micro lenses 333 may be provided on the respective pixels PX.

In the image sensor 1, light may be incident on the first surface 300a of the upper substrate 300. For example light may come through the first surface 300a, and may go into the photoelectric conversion region PD of the pixel PX. The interconnection layer 200 may be disposed on the second surface 300b of the upper substrate 300, and thus photoelectric efficiency of the image sensor 1 may be improved. For example, because the interconnection layer 200 formed with conductive patterns 202 is disposed on the second surface 300b of the upper substrate 300 and because the light comes through the first surface 300a into the photoelectric conversion region PD, the photoelectric efficiency of the image sensor 1 may be improved. For example, the conductive patterns 202 may not block the light that comes through the first surface 300a and goes into the photoelectric conversion region PD. Some of the conductive patterns 202 may be electrically connected to the floating diffusion regions FD and the source/drain regions SDR. Even though not shown in the drawings, others of the conductive patterns 202 may be connected to the gate electrodes TG, SG, RG, and AG.

Figure 4A:
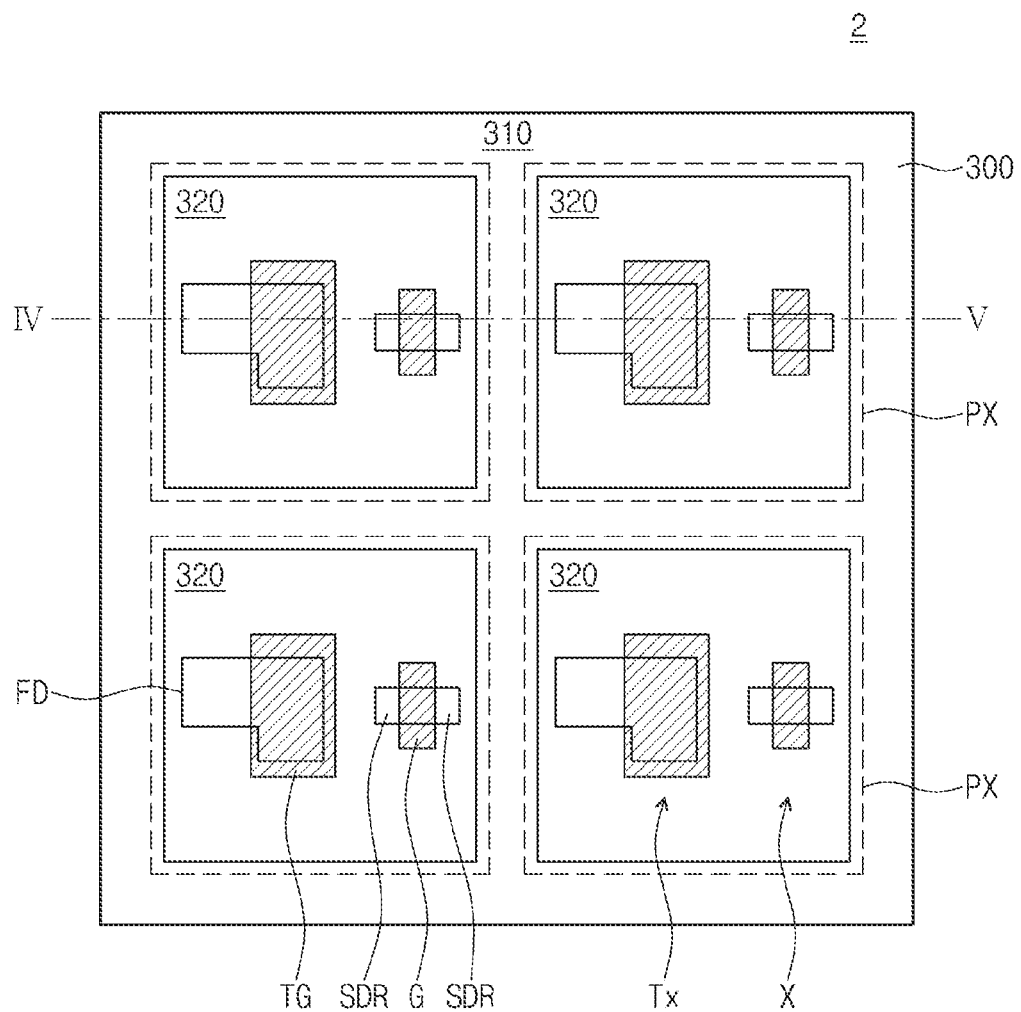
FIG. 4A is an enlarged view of a region 'I' of FIG. 3A to illustrate an image sensor according to some embodiments of the inventive concepts.
Figure 4B:
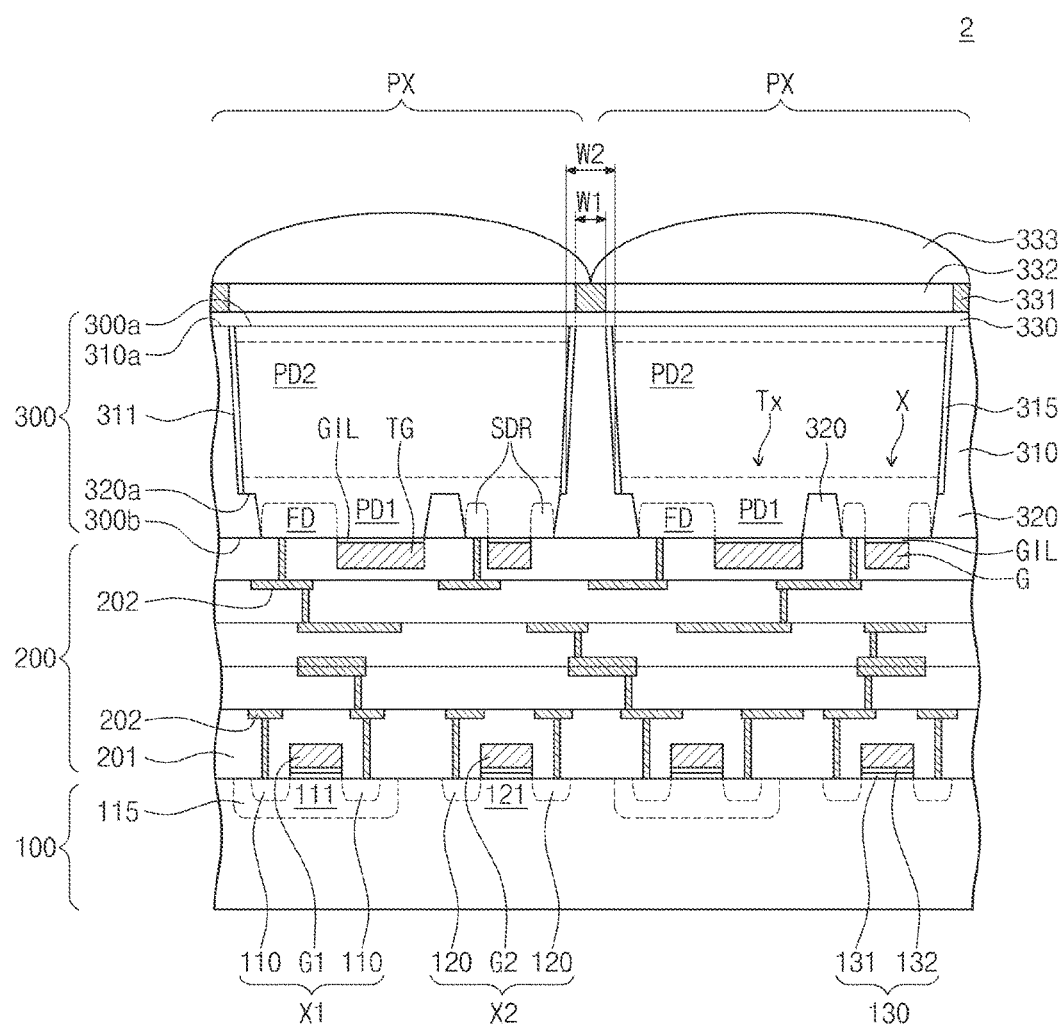
FIG. 4B is an exemplary cross-sectional view taken along a line IV-V of FIG. 4A.

FIG. 4A is an enlarged view of a region corresponding to T of FIG. 3A to illustrate an image sensor 2 according to some embodiments of the inventive concepts. FIG. 4B is a cross-sectional view taken along a line IV-V of FIG. 4A. Hereinafter, the descriptions to the same elements as mentioned above will be omitted or mentioned briefly for ease and convenience of explanation.

Referring to FIGS. 1, 2, 4A, and 4B, an image sensor 2 may include a lower substrate 100, an interconnection layer 200, and an upper substrate 300. The lower substrate 100 may include dopants of a first conductivity type. The lower substrate 100 may include a first lower transistor X1 of the first conductivity type and a second lower transistor X2 of a second conductivity type. Gate insulating patterns 130 may be provided between a first lower gate electrode G1 of the first lower transistor X1 and the lower substrate 100 and between a second lower gate electrode G2 of the second lower transistor X2 and the lower substrate 100, respectively. The gate insulating pattern 130 may include a silicon oxide pattern 131 and a silicon nitride pattern 132. The interconnection layer 200 may be disposed on the lower substrate 100 so as to be connected to source/drain portions 110 and 120 and the lower gate electrodes G1 and G2 of the first and second transistors X1 and X2. For example, conductive patterns 202 of the interconnection layer 200 may be electrically coupled to source/drain portions 110 and 120 and/or the lower gate electrodes G1 and G2.

The upper substrate 300 may be disposed on the interconnection layer 200. The upper substrate 300 may include dopants of which a conductivity type (e.g., the first conductivity type) is the same as that of the lower substrate 100. The upper substrate 300 may include upper transistors Tx and X. Since the lower transistors X1 and X2 may function as logic transistors, the upper transistors Tx and X may include transfer transistors Tx and sensing transistors X. For example, the transfer transistor Tx of the sensor 2 may be the same as the transfer transistor Tx described with reference to FIGS. 2 and 3A to 3C, and the sensing transistor X may corresponding to any one of the source follower transistor Sx, the reset transistor Rx, and the selection transistor Ax described with reference to FIG. 2. Neighboring pixels PX may share the sensing transistor X through the interconnection layer 200. Thus, an integration density of the image sensor 2 may be improved. Since the lower substrate 100 includes the logic transistors, the upper transistors Tx and X may not function as the logic transistor. For example, the upper transistors Tx and X may function as image-sensing transistors. The upper transistors Tx and X may have the same conductivity type. For example, the upper transistors Tx and X may be transistors of the second conductivity type, and transistors of the first conductivity type may not be provided on the upper substrate 300.

A first device isolation pattern 310, a doped isolation layer 315, a second device isolation pattern 320, and a photoelectric conversion region PD1 and PD2 may be provided in the upper substrate 300 of each of the pixels PX. A width W1 of a top surface 310a of the first device isolation pattern 310 may be smaller than a width W2 of a bottom surface of the first device isolation pattern 310. At this time, the top surface 310a of the first device isolation pattern 310 may be adjacent to the first surface 300a of the upper substrate 300, and the bottom surface of the first device isolation pattern 310 may be adjacent to the second device isolation pattern 320. A width of the first device isolation pattern 310 may progressively decrease from the bottom surface toward the top surface 310a of the first device isolation pattern 310. For example, the first device isolation pattern 310 may have a trapezoid shape in a cross-sectional view. In some embodiments, the first device isolation pattern 310 may have an isosceles trapezoid shape in a cross-sectional view. As illustrated in FIG. 4A, the second device isolation pattern 320 may overlap with the first device isolation pattern 310 with respect to a plan view. As illustrated in FIG. 4B, at least a portion of the second device isolation pattern 320 may be connected to the first device isolation pattern 310. The second device isolation pattern 320 may be provided in the upper substrate 300 to define an active region in which a floating diffusion region FD and source/drain regions SDR are formed. The photoelectric conversion region PD1 and PD2 may function and act as the photoelectric conversion region PD described with reference to FIG. 2. The first dopant region PD1 may be a region doped with dopants of the first conductivity type. The second dopant region PD2 may be a region doped with dopants of the second conductivity type. A distance between the first dopant region PD1 and the second surface 300b of the upper substrate 300 may be smaller than a distance between the second dopant region PD2 and the second surface 300b of the upper substrate 300. For example, the first dopant region PD1 may be closer than the second dopant region PD2 to the interconnection layer 200. The floating diffusion region FD and the source/drain regions SDR may be regions doped with dopants of the second conductivity type. The floating diffusion region FD and the source/drain regions SDR may be provided in the first dopant region PD1, and the second dopant region PD2 may be disposed between the first dopant region PD1 and the first surface 300a of the upper substrate 300.

A transfer gate electrode TG and a sensing gate electrode G may be provided on the upper substrate 300 of each of the pixels PX. The transfer gate electrode TG may be the same as those transfer gate electrodes TG described above. The sensing gate electrode G may correspond to any one of the source follower gate electrode SG, the reset gate electrode RG, and the selection gate electrode AG described with reference to FIGS. 2 and 3A to 3C. Neighboring pixels PX may share the sensing gate electrode G through the interconnection layer 200. However, embodiments of the inventive concepts are not limited to the number and the position of the sensing gate electrode G of the pixel PX illustrated in FIGS. 4A and 4B. For example, the number and the position of the sensing gate electrode G of the pixel PX may be variously modified. For example, each of the pixels PX may have a photo-gate structure similar to a three-transistor structure, a four-transistor structure, or a five-transistor structure.

A gate insulating layer GIL may be disposed between the upper substrate 300 and each of the gate electrodes TG and G. The gate insulating layer GIL may include silicon oxide but may not include nitrogen. An additional silicon nitride layer (not shown) may not be disposed between the upper substrate 300 and each of the gate electrodes TG and G. The gate insulating layers GIL may be in contact (e.g. physical contact) with the upper substrate 300 and the gate electrodes TG and G.

A buffer layer 330, a grid pattern 331, color filters 332, and micro lenses 333 may be disposed on the first surface 300a of the upper substrate 300. The interconnection layer 200 may be electrically connected to the gate electrodes TG and G, the floating diffusion region FD, and the source/drain regions SDR. For example, conductive patterns 202 of the interconnection layer 200 may be electrically coupled to the gate electrodes TG and G, the floating diffusion region FD, and/or the source/drain regions SDR.

Figure 5:
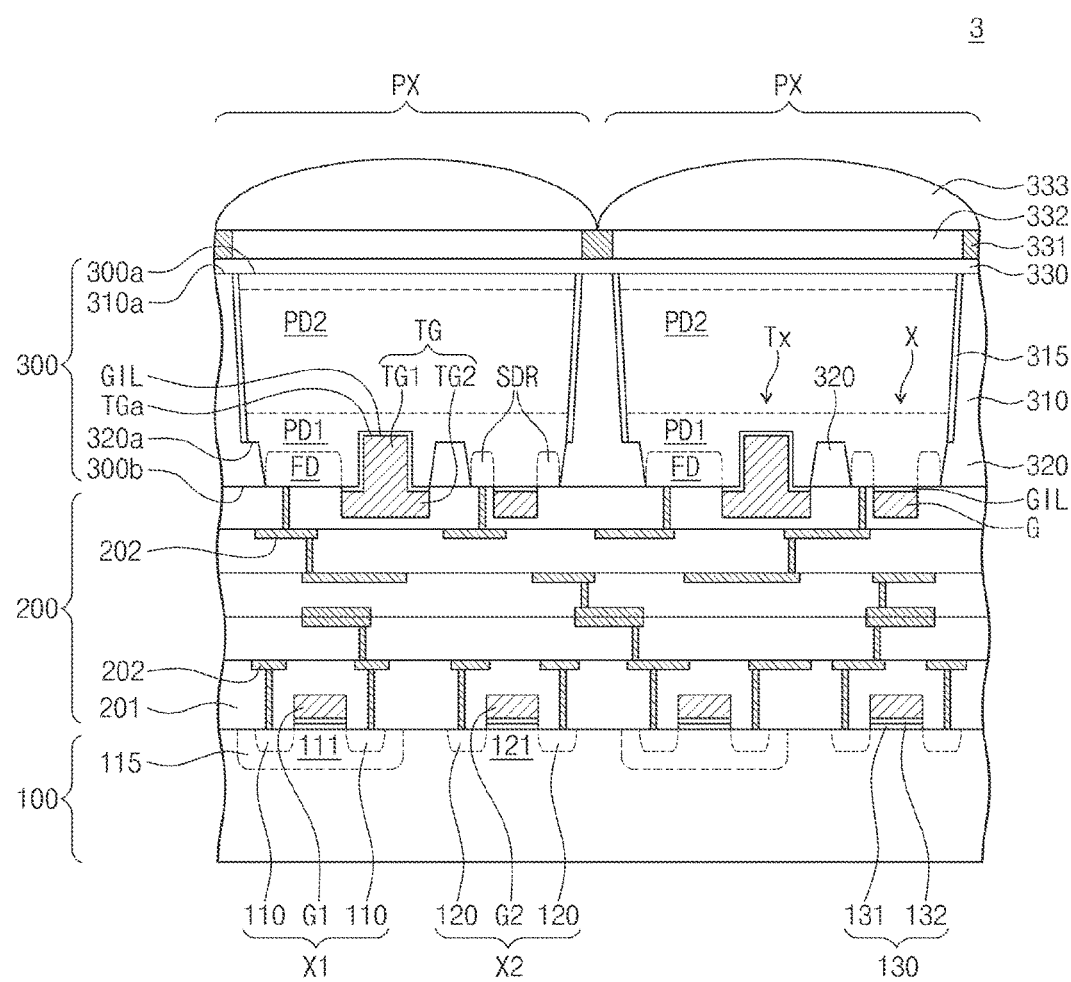
FIG. 5 is a cross-sectional view illustrating an image sensor according to some embodiments of the inventive concepts.

FIG. 5 is a cross-sectional view corresponding to a view taken along the line IV-V of FIG. 4A to illustrate an image sensor 3 according to some embodiments of the inventive concepts. Hereinafter, the descriptions to the same elements as mentioned above will be omitted or mentioned briefly for ease and convenience of explanation.

Referring to FIGS. 4A and 5, an image sensor 3 may include a lower substrate 100, an interconnection layer 200, and an upper substrate 300. The lower substrate 100 and the interconnection layer 200 may be the same as those described with reference to FIGS. 4A and 4B. For example, the lower substrate 100 may be a substrate having the first conductivity type. The lower transistors X1 and X2 of the lower substrate 100 may include the first lower transistor X1 of the first conductivity type and the second lower transistor X2 of the second conductivity type. The gate insulating pattern 130 may include a silicon oxide pattern 131 and a silicon nitride pattern 132.

The upper substrate 300 may be a substrate having the first conductivity type. Upper transistors Tx and X of the upper substrate 300 may include a transfer transistor Tx and a sensing transistor X. A logic transistor may not be provided on the upper substrate 300. The upper transistors Tx and X may be transistors of the second conductivity type, and transistors of the first conductivity type may not be provided on the upper substrate 300.

The upper substrate 300 may include a first device isolation pattern 310, a doped isolation layer 315, a second device isolation pattern 320, a photoelectric conversion region PD1 and PD2, a floating diffusion region FD, source/drain regions SDR, a transfer gate electrode TG, and a sensing gate electrode G. A top surface TGa (e.g., a surface adjacent to the upper substrate 300) of the transfer gate electrode TG may be disposed in the upper substrate 300. For example, the top surface TGa of the transfer gate electrode TG may be disposed in the first dopant region PD1 of the photoelectric conversion region including first and second dopant regions PD1 and PD2. The transfer gate electrode TG may include a first portion TG1 extending into the upper substrate 300 and a second portion TG2 disposed on the second surface 300b of the upper substrate 300. The second portion TG2 may be covered by or embedded in the interconnection layer 200. The second portion TG2 may be connected to the first portion TG1. The sensing gate electrode G may have a flat-type structure disposed on the second surface 300b of the upper substrate 300. For example, the sensing gate electrode G may have a substantially the same thickness throughout its width, and may have a rectangular shape in a cross-sectional view. For example, a top surface (e.g., a surface adjacent to the upper substrate 300) of the sensing gate electrode G may be disposed at a lower level than the second surface 300b of the upper substrate 300 and may be substantially parallel to the second surface 300b of the upper substrate 300.

A gate insulating layer GIL may be disposed between the upper substrate 300 and each of the gate electrodes TG and G. The gate insulating layer GIL between the upper substrate 300 and the transfer gate electrode TG may extend from the second surface 300b into the upper substrate 300 along a surface of the first portion TG1 of the transfer gate electrode TG. The gate insulating layers GIL may be disposed between the upper substrate 300 and the second portion TG2 of the transfer gate electrode TG and between the upper substrate 300 and the sensing gate electrode G. The gate insulating layers GIL may include silicon oxide but may not include nitrogen. An additional silicon nitride layer (not shown) may not be disposed between the upper substrate 300 and each of the gate electrodes TG and G. For example, each of the silicon oxide layers forming the gate insulating layers GIL may be in contact with the upper substrate 300 and the gate electrodes TG or G.

Figure 6:
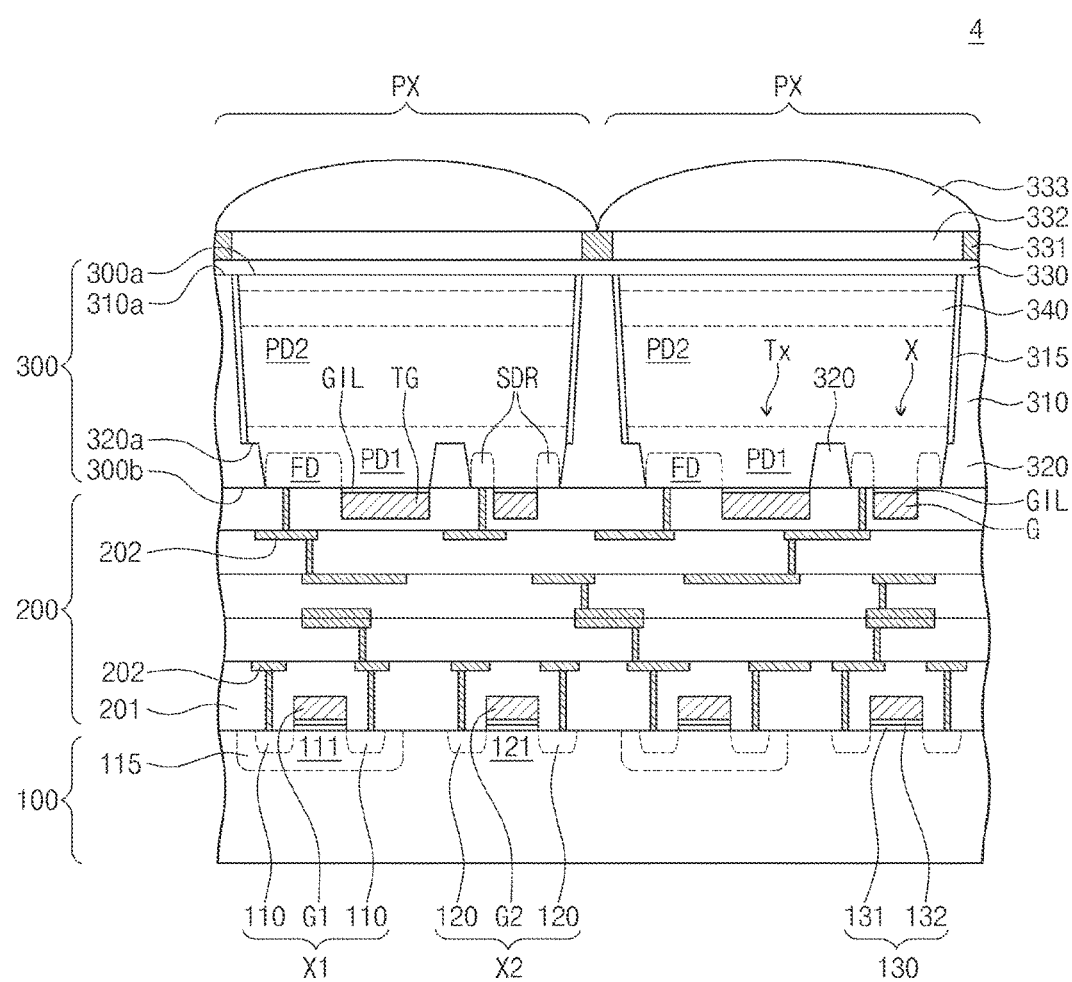
FIG. 6 is a cross-sectional view illustrating an image sensor according to some embodiments of the inventive concepts.

FIG. 6 is a cross-sectional view corresponding a view taken along the line IV-V of FIG. 4A to illustrate an image sensor 4 according to some embodiments of the inventive concepts. Hereinafter, the descriptions to the same elements as mentioned above will be omitted or mentioned briefly for ease and convenience of explanation.

Referring to FIGS. 4A and 6, an image sensor 4 may include a lower substrate 100, an interconnection layer 200, and an upper substrate 300. The lower substrate 100 may include dopants of a first conductivity type. The lower substrate 100 may include lower transistors X1 and X2.

The upper substrate 300 may be disposed on the interconnection layer 200. The upper substrate 300 may include dopants of which a conductivity type (e.g., a second conductivity type) is different from that of the lower substrate 100. Upper transistors Tx and X of the upper substrate 300 may have the same conductivity type. For example, the upper transistors Tx and X may be transistors of the second conductivity type, and transistors of the first conductivity type may not be provided on the upper substrate 300. A transfer gate electrode TG and a sensing gate electrode G may be provided on the upper substrate 300 of each of the pixels PX. The transfer gate electrode TG and the sensing gate electrode G may be the same as those described above.

The upper substrate 300 may include a first device isolation pattern 310, a doped isolation layer 315, and a second device isolation pattern 320.

A well region 340 may be provided in the upper substrate 300. The well region 340 may include dopants of which a conductivity type (e.g., the first conductivity type) is different from that of the upper substrate 300. A photoelectric conversion region PD1 and PD2 and a floating diffusion region FD, and source/drain regions SDR may be provided in the well region 340. The floating diffusion region FD and the source/drain regions SDR may be provided in the first dopant region PD1, and the second dopant region PD2 may be disposed between the first dopant region PD1 and the first surface 300a of the upper substrate 300. The photoelectric conversion region PD1 and PD2, the floating diffusion region FD, and the source/drain regions SDR may include dopants of the same conductivity type as described with reference to FIGS. 4A and 4B. For example, the first dopant region PD1 may be a region doped with dopants of the first conductivity type. The second dopant region PD2, the floating diffusion region FD, and the source/drain regions SDR may be regions doped with dopants of the second conductivity type.

A gate insulating layer GIL may be disposed between the upper substrate 300 and each of the gate electrodes TG and G. The gate insulating layer GIL may include silicon oxide but may not include nitrogen. The gate insulating layers GIL may be in contact (e.g. physical contact) with the upper substrate 300 and the gate electrodes TG and G.

FIGS. 7A to 7I are cross-sectional views taken along the line IV-V of FIG. 4A to illustrate a method of manufacturing an image sensor according to some embodiments of the inventive concepts. Hereinafter, the descriptions to the same technical features as mentioned above will be omitted or mentioned briefly for ease and convenience of explanation. In FIGS. 7A to 7I, terms 'top surface' and 'bottom surface' may be described based on FIG. 4B regardless of orientation. Some orientations in the below descriptions may be different from the orientations in FIG. 4B. However, the descriptions will be reasonably understood in the context with reference to the corresponding figures.

Figure 7A:
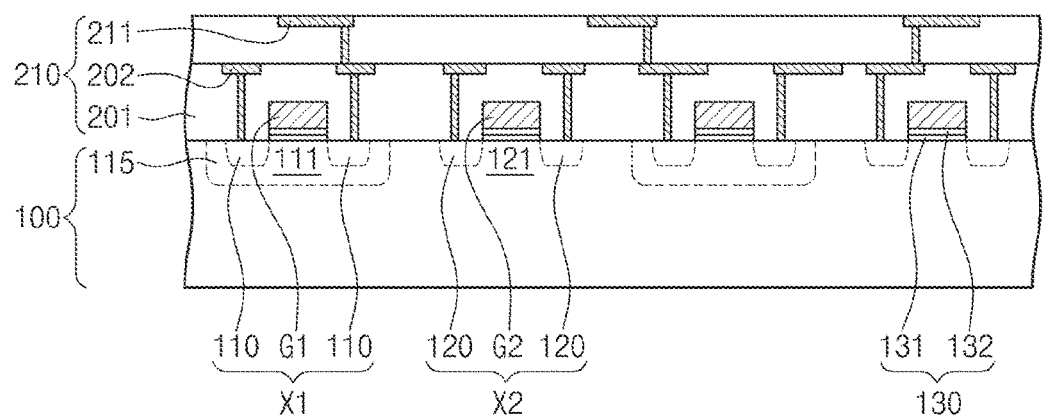
FIGS. 7A to 7I are cross-sectional views taken along the line IV-V of FIG. 4A to illustrate a method of manufacturing an image sensor according to some embodiments of the inventive concepts.

Referring to FIG. 7A, a lower interconnection layer 210 may be formed on a lower substrate 100. The lower substrate 100 may be the same as the lower substrate 100 described with reference to FIGS. 4A and 4B. The substrate 100 may be a substrate having a first conductivity type. Dopants of a second conductivity type may be injected into the lower substrate 100 to form a doped well region 115. An oxide layer (not shown) may be grown on a top surface of the lower substrate 100 by an oxidation process. The oxide layer may include silicon oxide. An ion implantation process using nitrogen and a thermal treatment process may be performed on the oxide layer. Nitrogen implanted in the oxide layer may be annealed by the thermal treatment process, and thus a nitride layer (not shown) may be formed on the oxide layer. A silicon oxide pattern 131 and a silicon nitride pattern 132 may be formed by patterning the nitride layer and the oxide layer. The silicon oxide pattern 131 and the silicon nitride pattern 132 may constitute a gate insulating pattern 130. A first lower gate electrode G1, first source/drain portions 110, a second lower gate electrode G2, and second source/drain portions 120 may be respectively formed to fabricate a first lower transistor X1 and a second lower transistor X2. For example, the first lower transistor X1 may be a P-type transistor (i.e., a P-channel transistor) and the second lower transistor X2 may be an N-type transistor (i.e., an N-channel transistor). However, embodiments of the inventive concepts are not limited thereto. The first lower gate electrode G1 may include dopants having the same conductivity type as the first source/drain portions 110, and the second lower gate electrode G2 may include dopants having the same conductivity type as the second source/drain portions 120. For example, the first lower gate electrode G1 may include boron (B) and the second lower gate electrode G2 may include arsenic (As) or phosphorus (P).

The lower interconnection layer 210 may be formed on the lower substrate 100 and may cover the first and second lower gate electrodes G1 and G2. The lower interconnection layer 210 may include at least one insulating pattern 201 and conductive patterns 202. At least some of the conductive patterns 202 may be connected to the first lower gate electrode G1, the first source/drain portions 110, the second lower gate electrode G2, and the second source/drain portions 120. At least one first pad 211 may be formed on a top surface of the lower interconnection layer 210.

Figure 7B:
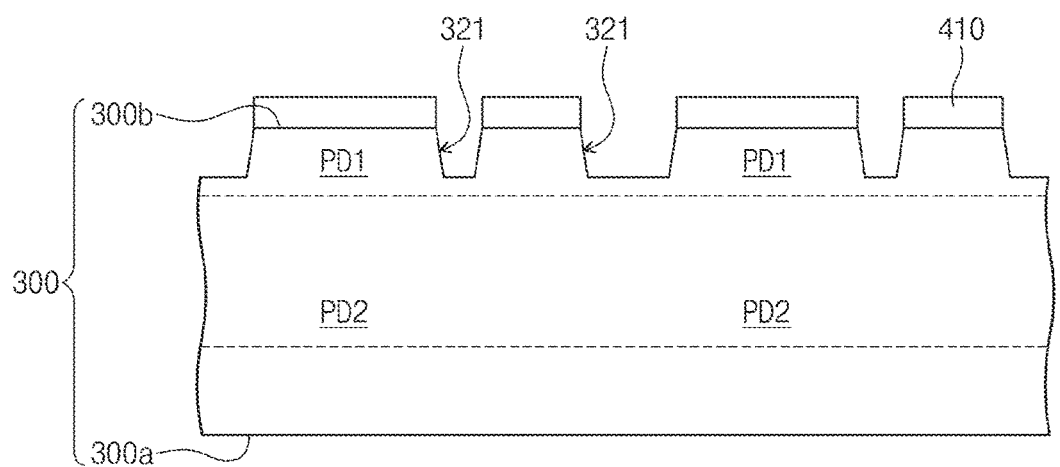

Referring to FIG. 7B, an upper substrate 300 of a first conductivity type may be prepared. The upper substrate 300 may have a first surface 300a and a second surface 300b opposite to each other. A plurality of dopant injection processes may be provided on the upper substrate 300 to form a photoelectric conversion region PD1 and PD2. The photoelectric conversion region PD1 and PD2 may include a first dopant region PD1 and a second dopant region PD2. A distance between the first dopant region PD1 and the second surface 300b of the upper substrate 300 may be smaller than a distance between the second dopant region PD2 and the second surface 300b of the upper substrate 300. For example, the second dopant region PD2 may be formed under the first dopant region PD1. A first mask pattern 410 may be formed on the second surface 300b of the upper substrate 300. The first mask pattern 410 may expose a portion of the second surface 300b of the upper substrate 300. A first trench 321 may be formed in the upper substrate 300 by an etching process using the first mask pattern 410 as an etch mask.

Figure 7C:
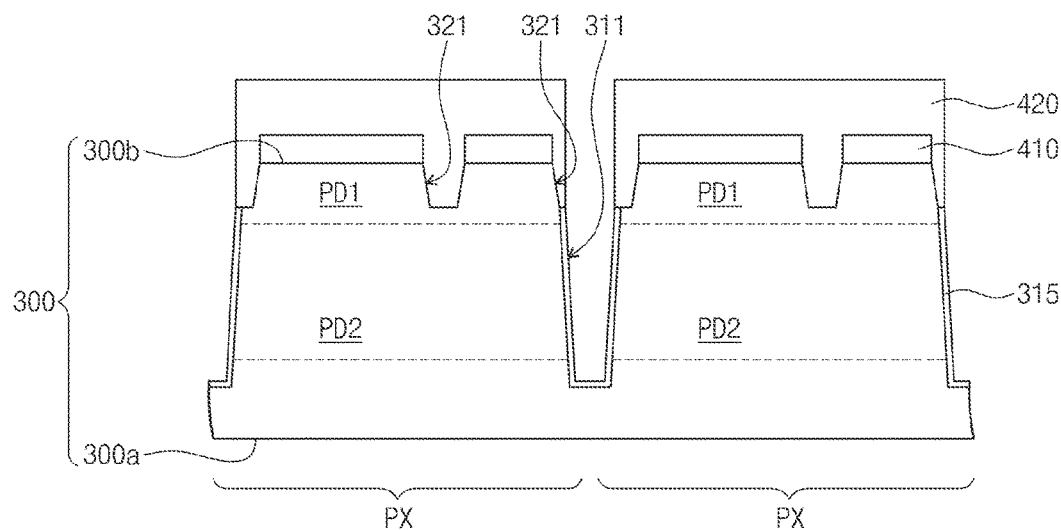

Referring to FIG. 7C, a second trench 311 may be formed in the upper substrate 300. For example, a second mask pattern 420 may be formed on the second surface 300b of the upper substrate 300 to expose a portion of a bottom surface of the first trench 321. The upper substrate 300 may be etched using the second mask pattern 420 as an etch mask. The second trench 311 may be formed in the upper substrate 300 by the etching process using the second mask pattern 420 as the etch mask. A depth of the second trench 311 may be deeper than that of the first trench 321. The second trench 311 may overlap with the first trench 321 with respect to a plan view. A width of the second trench 311 may progressively decrease toward the first surface 300a of the upper substrate 300. Dopants may be injected into the upper substrate 300 through the second trench 311 to form a doped isolation layer 315 extending along an inner surface of the second trench 311. The doped isolation layer 315 may include dopants of the first conductivity type. The first mask pattern 410 and the second mask pattern 420 may be removed. In some embodiments, a formation order of the first and second trenches 321 and 311 may not be limited thereto but may be variously modified. For example, the first trench 321 may be formed after the formation of the second trench 311.

Figure 7D:
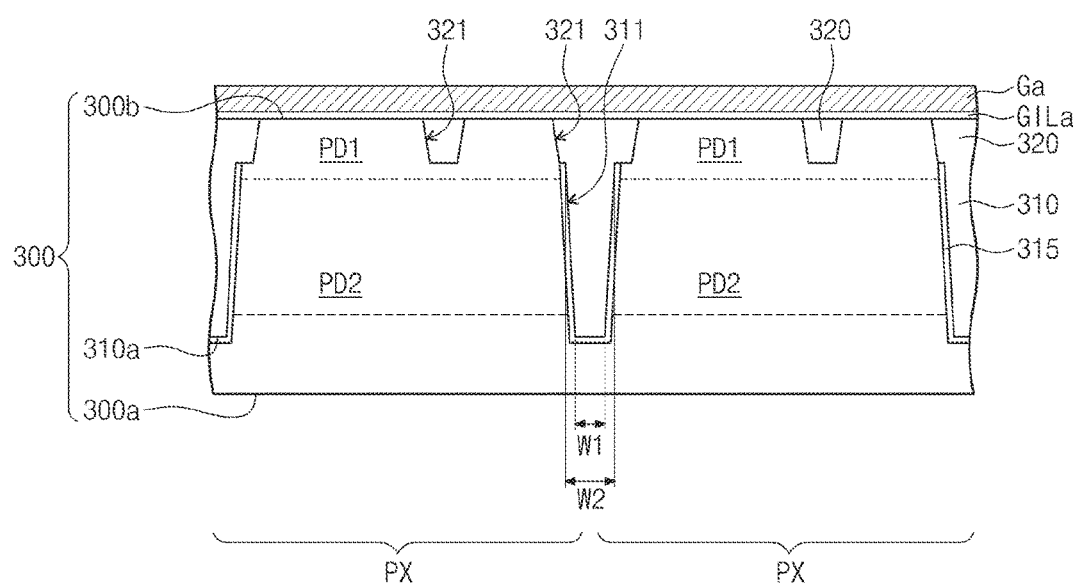

Referring to FIG. 7D, device isolation patterns 310 and 320 may be formed in the trenches 321 and 311, and an insulating layer GILa and a gate layer Ga may be formed on the upper substrate 300. In some embodiments, an insulating material may be provided into the first trench 321 and the second trench 311 to form a first device isolation pattern 310 and a second device isolation pattern 320. The first device isolation pattern 310 may include the same material as the second device isolation pattern 320. A width W1 of a top surface 310a of the first device isolation pattern 310 may be smaller than a width W2 of a bottom surface of the first device isolation pattern 310. The top surface 310a of the first device isolation pattern 310 may be adjacent to the first surface 300a of the upper substrate 300. Pixels PX may be defined by the first device isolation pattern 310.

The insulating layer GILa may be formed on the second surface 300b of the upper substrate 300. For example, the insulating layer GILa may include a silicon oxide layer. A nitrogen ion implantation process and a thermal treatment process (e.g., an annealing process) may not be performed, and thus the insulating layer GILa may not include silicon nitride. The insulating layer GILa may be formed on the pixels PX at the same time. The gate layer Ga may be formed on the insulating layer GILa. The gate layer Ga may include poly-silicon.

Figure 7E:
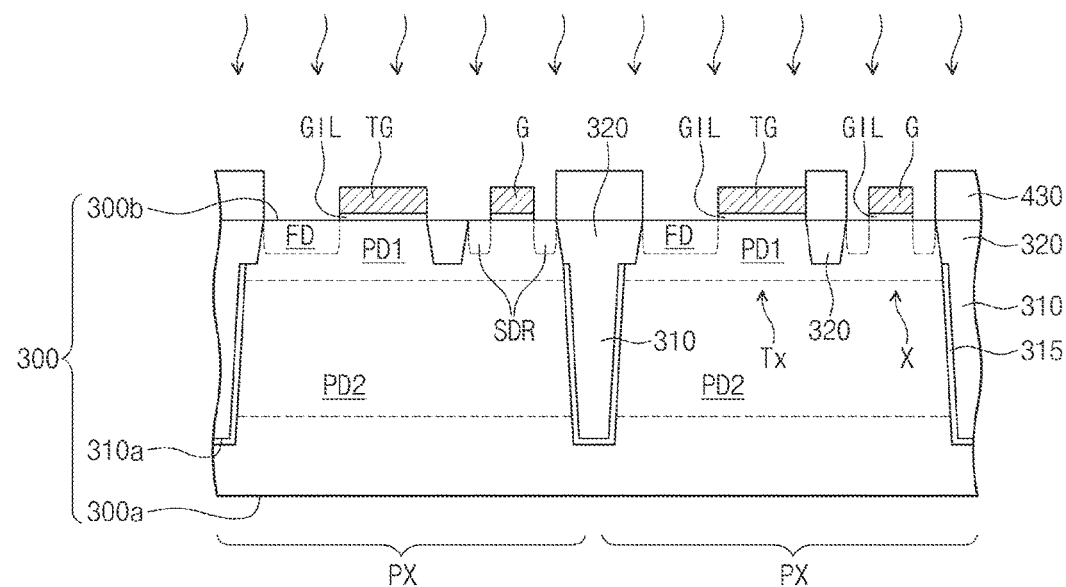

Referring to FIG. 7E, gate insulating layers GIL, gate electrodes TG and G, floating diffusion regions FD, and source/drain regions SDR may be formed in the upper substrate 300. For example, the gate layer Ga and the insulating layer GILa may be patterned to form the gate insulating layers GIL and the gate electrodes TG and G.

A mask layer 430 covering the second device isolation pattern 320 may be formed on the second surface 300b of the upper substrate 300. Dopants of the second conductivity type may be injected into the second surface 300b of the upper substrate 300 exposed by the mask layer 430, thereby forming the floating diffusion regions FD and the source/drain regions SDR. The dopants of the second conductivity type may also be injected into the gate electrodes TG and G. Thus, the gate electrodes TG and G formed on the upper substrate 300 and the source/drain regions SDR may include the dopants of the second conductivity type. Source/drain regions of the first conductivity type may not be formed in the upper substrate 300, and thus processes of manufacturing the image sensor 2 may be simplified. For example, this embodiment may omit a process of forming a mask (not shown) covering the source/drain regions SDR of the second conductivity type and a process of injecting dopants of the first conductivity type. The dopant injection process for the formation of the source/drain regions SDR may use dopants having relatively low mobility, e.g., arsenic (As) or phosphorus (P). Thus, this embodiment may omit a process of forming a silicon nitride layer (not shown) that may be formed for minimizing or preventing the migration of the dopants. Thus, processes of manufacturing the image sensor 2 may be simplified. The mask layer 430 may be removed.

Figure 7F:
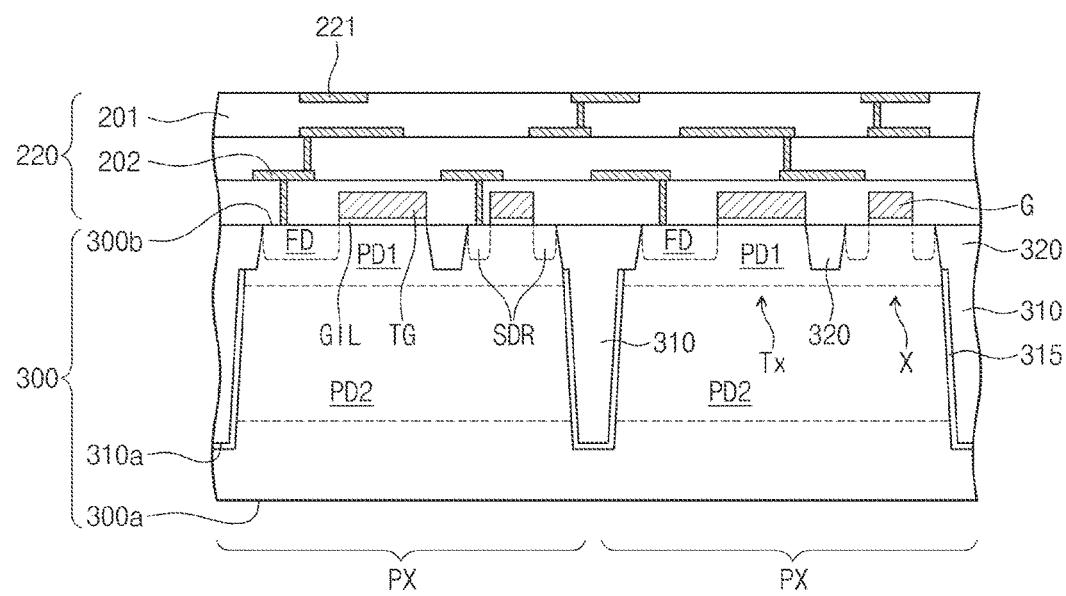

Referring to FIG. 7F, an upper interconnection layer 220 may be formed on the second surface 300b of the upper substrate 300 to cover the gate electrodes TG and G. The upper interconnection layer 220 may include at least one insulating pattern 201 and conductive patterns 202. Some of the conductive patterns 202 may be electrically connected to the floating diffusion regions FD, the source/drain regions SDR, and the gate electrodes TG and G respectively. At least one second pad 221 may be formed on a surface of the upper interconnection layer 220.

Figure 7G:
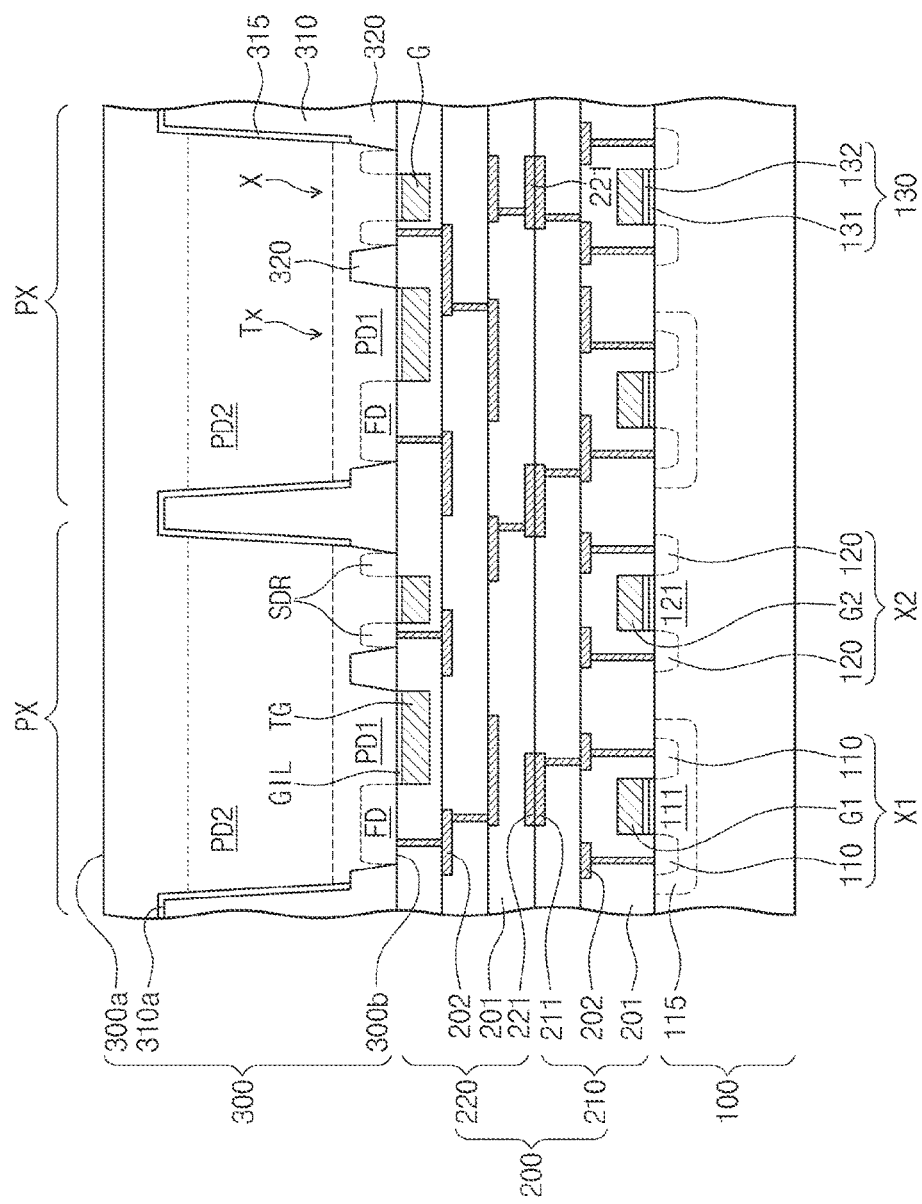

Referring to FIG. 7G, the upper substrate 300 may be stacked on the lower substrate 100. For example, the lower substrate 100 and the lower interconnection layer 210 of FIG. 7A may be prepared. The upper substrate 300 may be manufactured as described above with reference to FIGS. 7B to 7F. The upper substrate 300 may be turned over such that the first surface 300a of the upper substrate 300 faces upward. The second pad 221 of the upper interconnection layer 220 may be connected to the first pad 211 of the lower interconnection layer 210, and thus the upper interconnection layer 220 may be electrically connected to the lower interconnection layer 210. An interconnection layer 200 may include the lower interconnection layer 210 and the upper interconnection layer 220 and may be disposed between the lower substrate 100 and the upper substrate 300. The upper substrate 300 may be electrically connected to the lower substrate 100 through the interconnection layer 200.

Figure 7H:
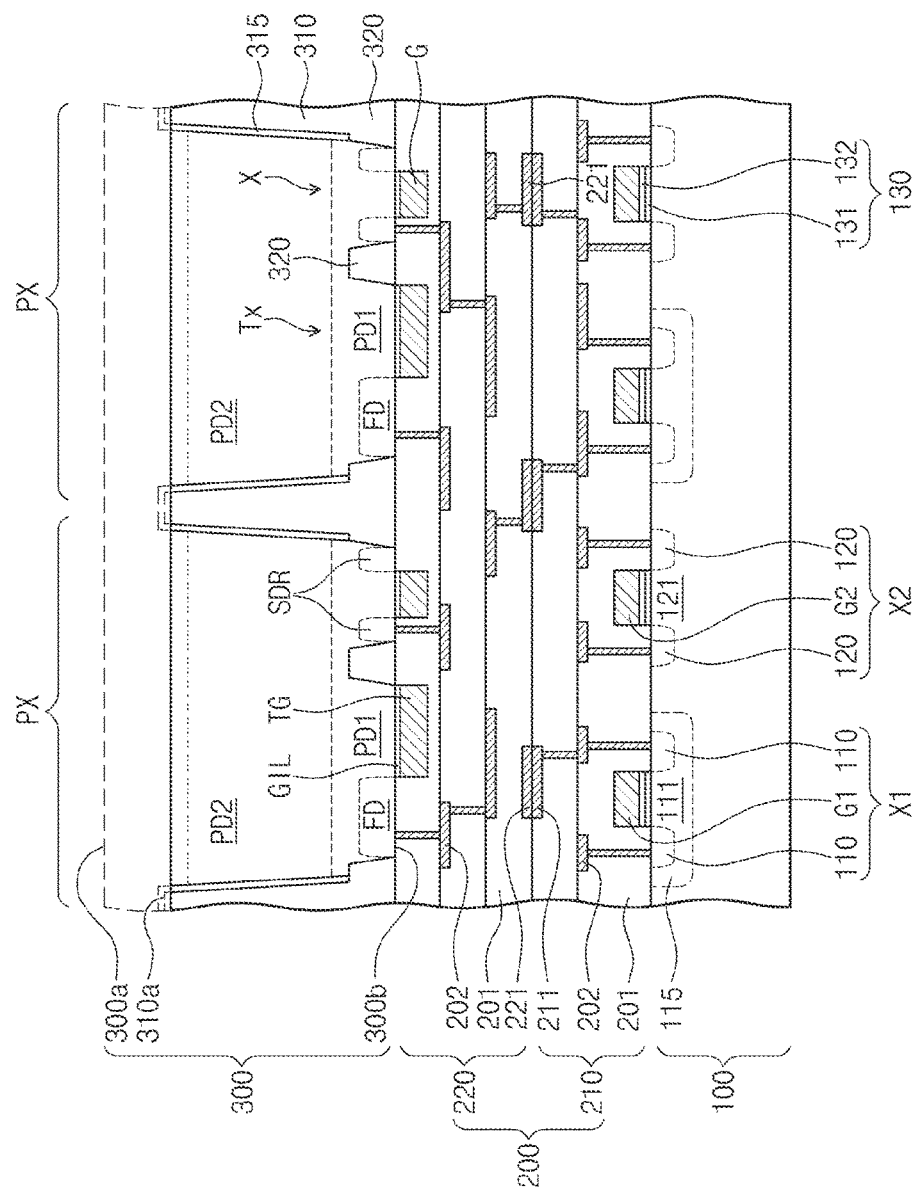

Referring to FIG. 7H, a chemical mechanical polishing (CMP) process or a grinding process may be performed on the first surface 300a of the upper substrate 300, and thus a portion of the upper substrate 300 may be removed. For example, a dash-lined portion from the first surface 300a as illustrated in FIG. 7H may be removed by the CMP process. The removal of the upper substrate 300 may be performed until (or until after) the top surface 310a of the first device isolation pattern 310 is exposed.

Figure 7I:
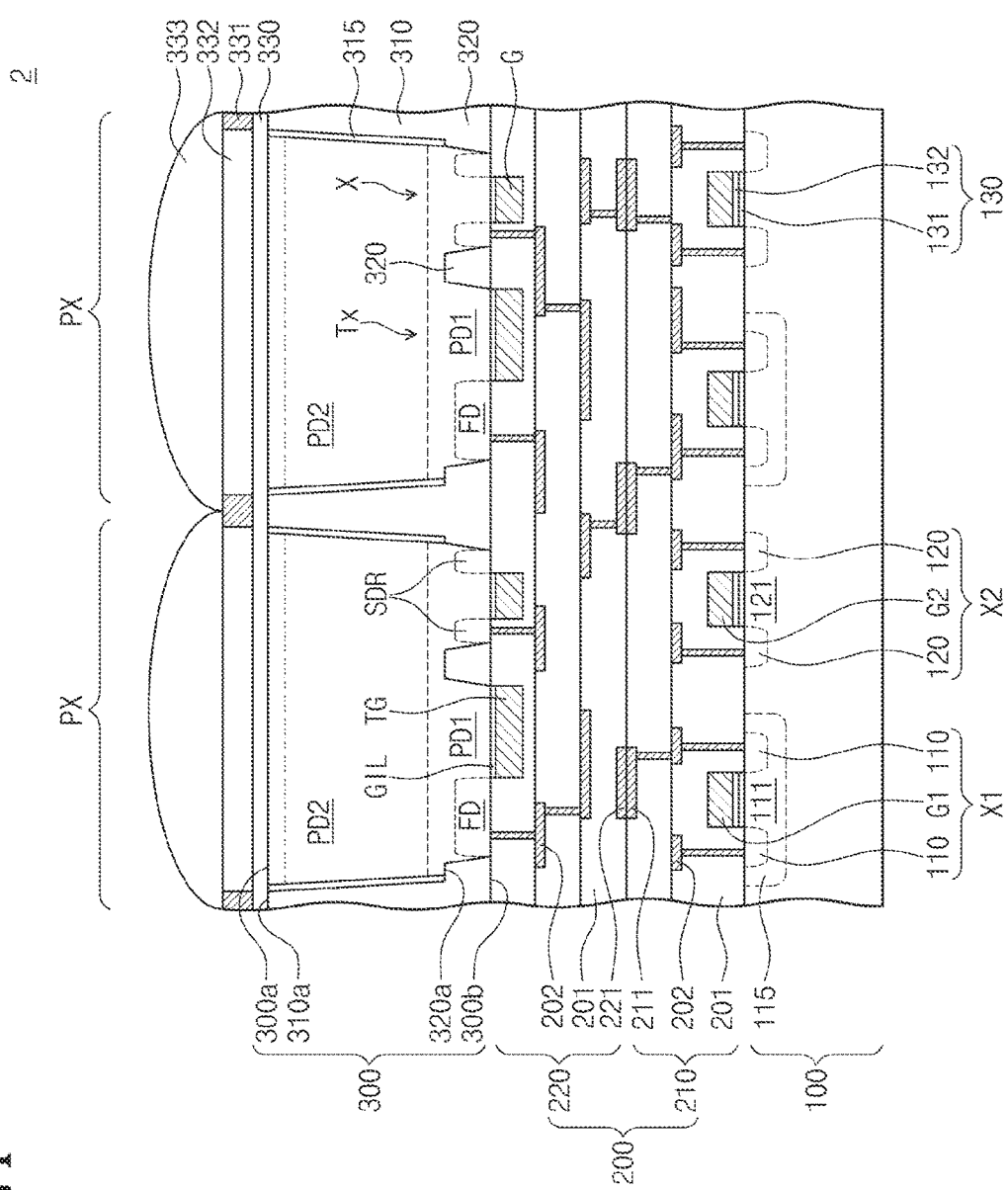

Referring to FIG. 7I, a buffer layer 330, a grid pattern 331, color filters 332, and micro lenses 333 may be formed on the polished or ground first surface 300a of the upper substrate 300. The image sensor 2 of FIGS. 4A and 4B may be manufactured by the manufacturing processes described above. The manufacturing processes may be applied to manufacture other image sensors of the embodiments described above (e.g. image sensors 3 and/or 4).

Figure 8:
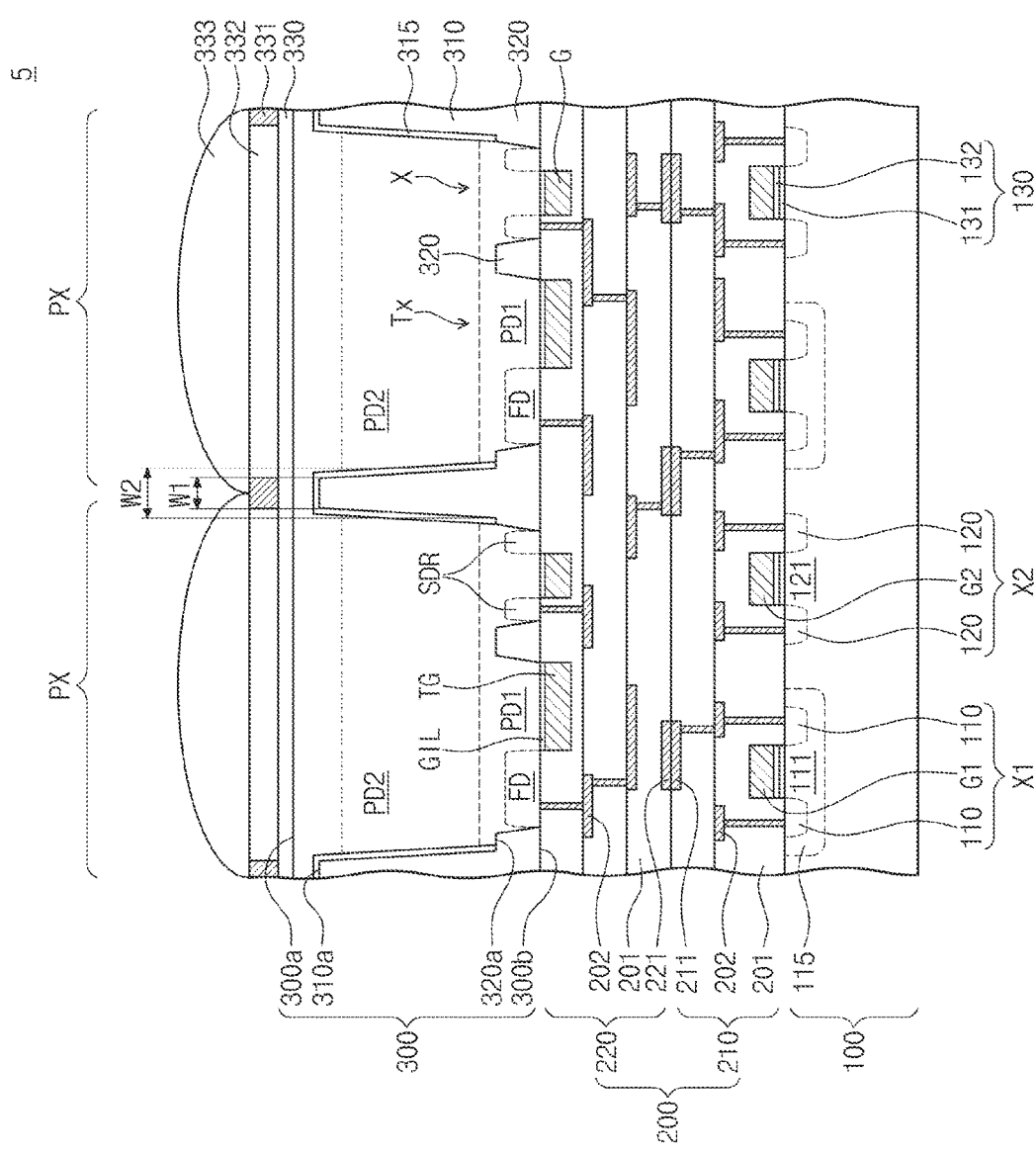
FIG. 8 is a cross-sectional view illustrating an image sensor according to some embodiments of the inventive concepts.

FIG. 8 is a cross-sectional view corresponding to a view taken along the line IV-V of FIG. 4A to illustrate an image sensor 5 according to some embodiments of the inventive concepts. Hereinafter, the descriptions to the same elements as mentioned above will be omitted or mentioned briefly for ease and convenience of explanation.

Referring to FIGS. 1, 2, 4A, and 8, an image sensor 5 may include a lower substrate 100, an interconnection layer 200, and an upper substrate 300. The lower substrate 100, the interconnection layer 200, and the upper substrate 300 may be the same as those described with reference to FIGS. 1, 2, 4A, and 4B. The image sensor 5 may be manufactured using the same method as described with reference to FIGS. 7A to 7I. The width W1 of the top surface 310a of the first device isolation pattern 310 may be smaller than the width W2 of the bottom surface of the first device isolation pattern 310. However, the process of polishing or grinding the upper substrate 300 of FIG. 7G may be performed until the top surface 310a of the first device isolation pattern 310 is not exposed. Thus, the top surface 310a of the first device isolation pattern 310 may be spaced apart from the first surface 300a of the upper substrate 300.

FIGS. 9A to 9E are cross-sectional views corresponding to a view taken along the line IV-V of FIG. 4A to illustrate a method of manufacturing an image sensor according to some embodiments of the inventive concepts. Hereinafter, the descriptions to the same elements as mentioned above will be omitted or mentioned briefly for ease and convenience of explanation.

Figure 9A:
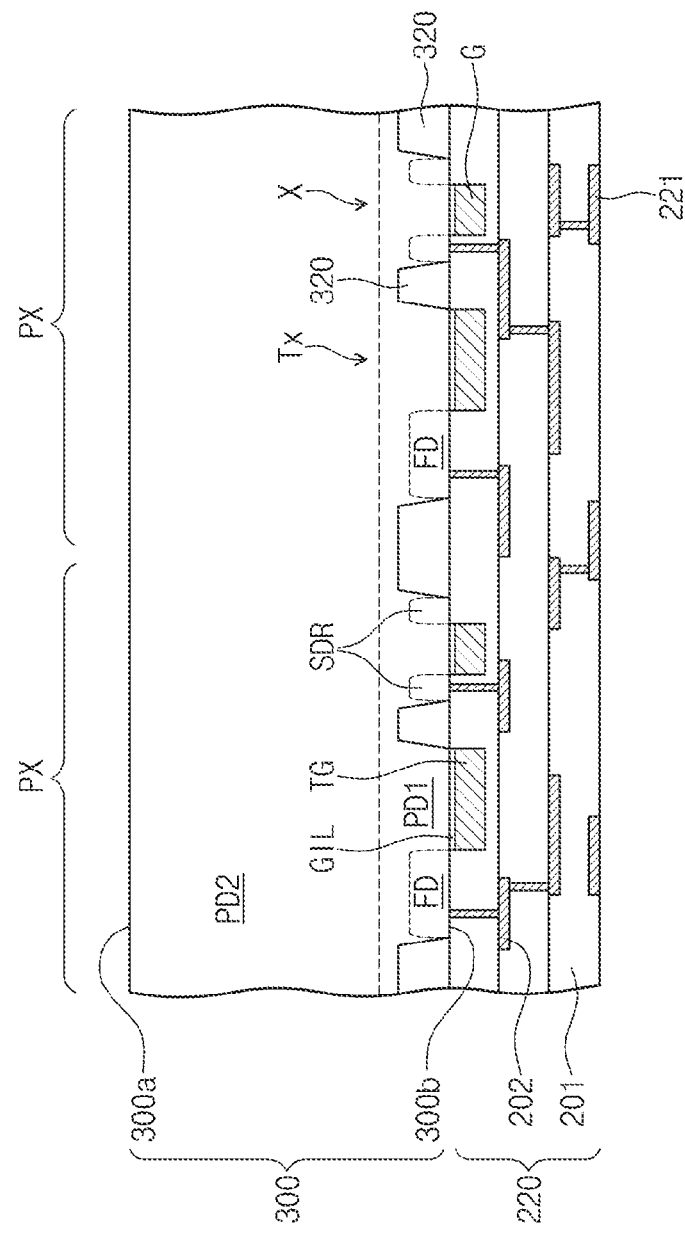
FIGS. 9A to 9E are cross-sectional views illustrating a method of manufacturing an image sensor according to some embodiments of the inventive concepts.

Referring to FIG. 9A, a second device isolation pattern 320, a photoelectric conversion region PD1 and PD2, a floating diffusion region FD, and source/drain regions SDR may be formed in an upper substrate 300. Gate insulating layers GIL, gate electrodes TG and G, and an upper interconnection layer 220 may be formed on the second surface 300b of the upper substrate 300. The second device isolation pattern 320, the photoelectric conversion region PD1 and PD2, the floating diffusion region FD, the source/drain regions SDR, the gate insulating layers GIL, the gate elec-trodes TG and G, and the upper interconnection layer 220 may be formed by the same processes as described with reference to FIGS. 7B to 7F. However, the first device isolation pattern 310 described with reference to FIGS. 7B and 7C may not be formed.

Figure 9B:
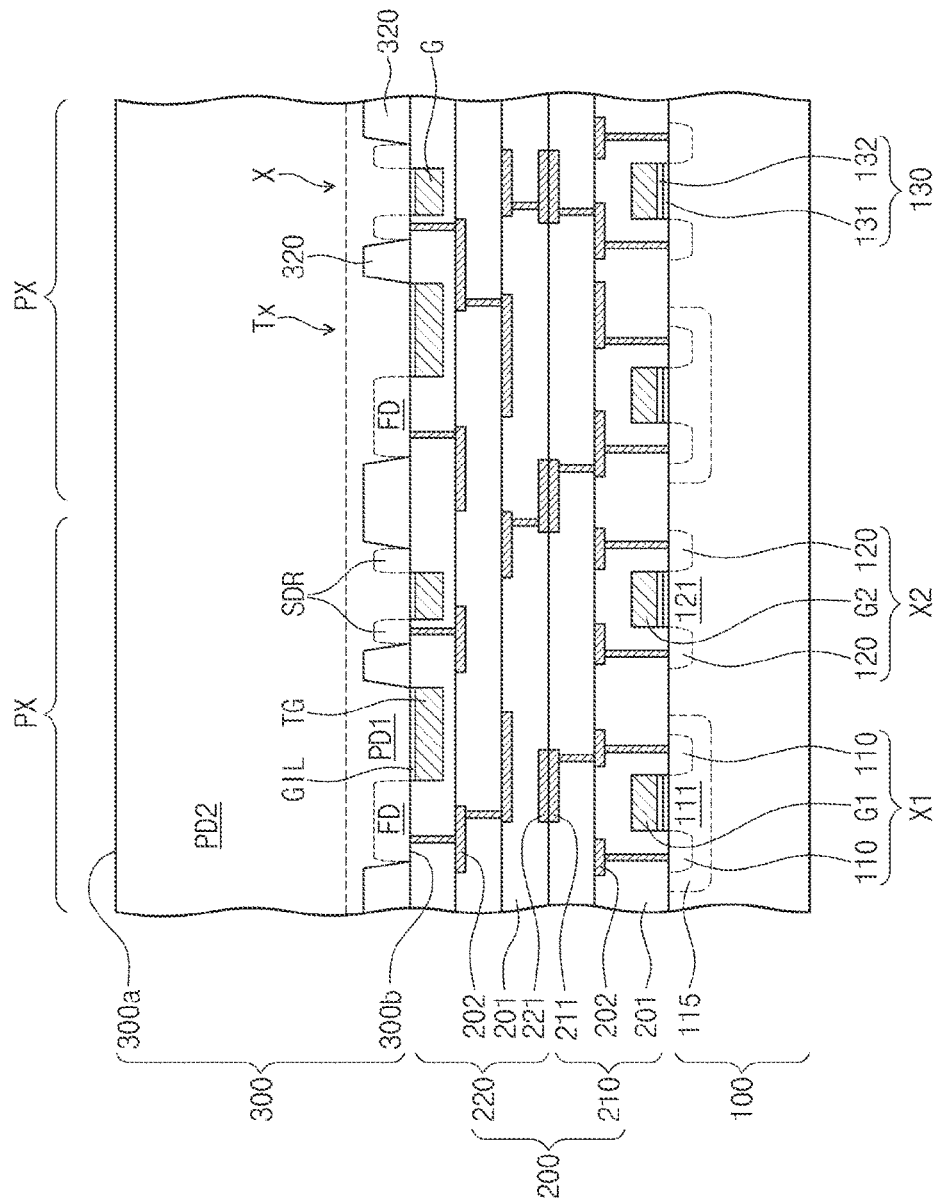

Referring to FIG. 9B, the upper substrate 300 may be provided on a lower substrate 100 in such a way that the upper interconnection layer 220 faces the lower substrate 100. Here, the lower substrate 100 and the lower interconnection layer 210 may be manufactured by the method described with reference to FIG. 7A. The upper substrate 300 and the upper interconnection layer 220 may be manufactured as described with reference to FIG. 9A. The second pad 221 of the upper interconnection layer 220 may be connected to the first pad 211 of the lower interconnection layer 210, and thus the upper interconnection layer 220 may be connected to the lower interconnection layer 210. For example, the conductive patterns 202 of the lower and upper interconnection layers 210 and 220 may be electrically coupled to one another. The lower and upper interconnection layers 210 and 220 may constitute an interconnection layer 200, and the interconnection layer 200 may be provided between the lower substrate 100 and the upper substrate 300.

Figure 9C:
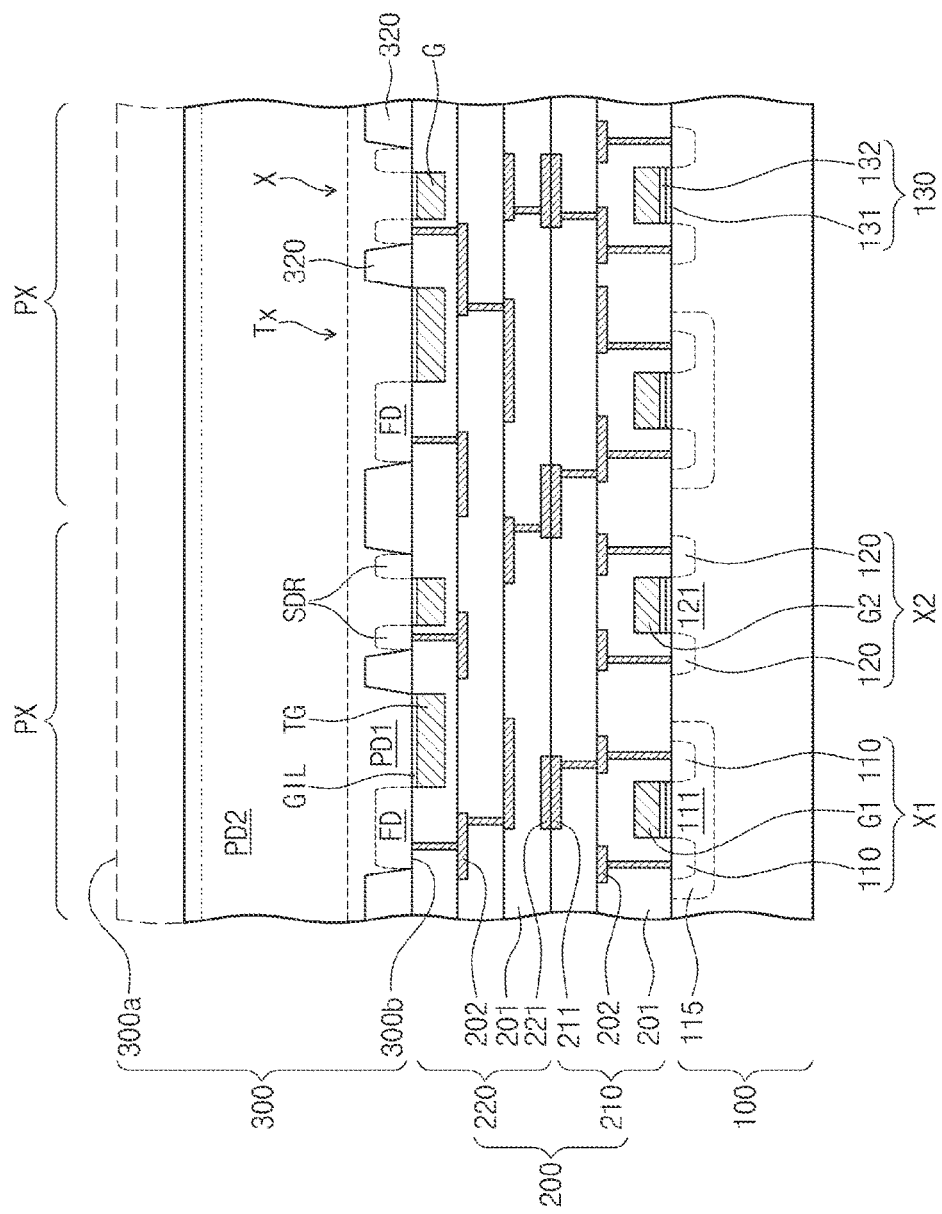

Referring to FIG. 9C, a CMP process or a grinding process may be performed on the first surface 300a of the upper substrate 300, and thus a portion of the upper substrate 300 may be removed. For example, a dash-lined portion from the first surface 300a as illustrated in FIG. 9C may be removed by the CMP process.

Figure 9D:
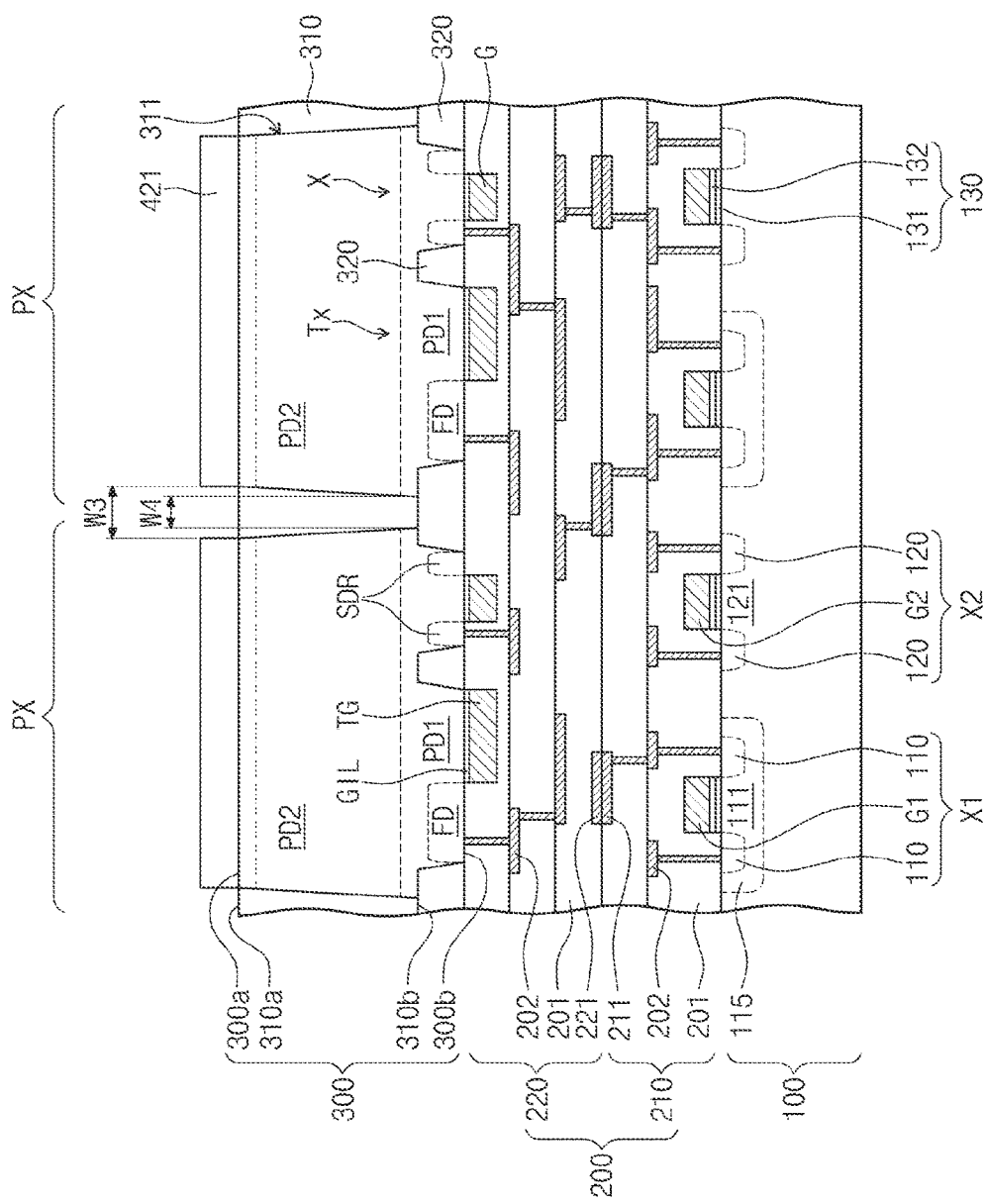

Referring to FIG. 9D, a first device isolation pattern 310 may be formed in the upper substrate 300 to define pixels PX. For example, a second mask pattern 421 may be formed on the first surface 300a of the upper substrate 300 to expose a portion of the first surface 300a of the upper substrate 300. The upper substrate 300 may be etched using the second mask pattern 421 as an etch mask to form a second trench 311 in the upper substrate 300. At this time, the second device isolation pattern 320 may act as an etch stop layer, and thus the second trench 311 may expose the second device isolation pattern 320. A width of the second trench 311 may progressively decrease toward the second surface 300b of the upper substrate 300. In certain embodiments, the second trench 311 may further extend into the second device isolation pattern 320 unlike FIG. 9D. The first device isolation pattern 310 may be formed by providing an insulating material into the second trench 311. A width W3 of a top surface 310a of the first device isolation pattern 310 may be greater than a width W4 of a bottom surface 310b of the first device isolation pattern 310. Unlike FIG. 7C, the doped isolation layer 315 may not be formed. Thereafter, the second mask patterns 421 may be removed.

Figure 9E:
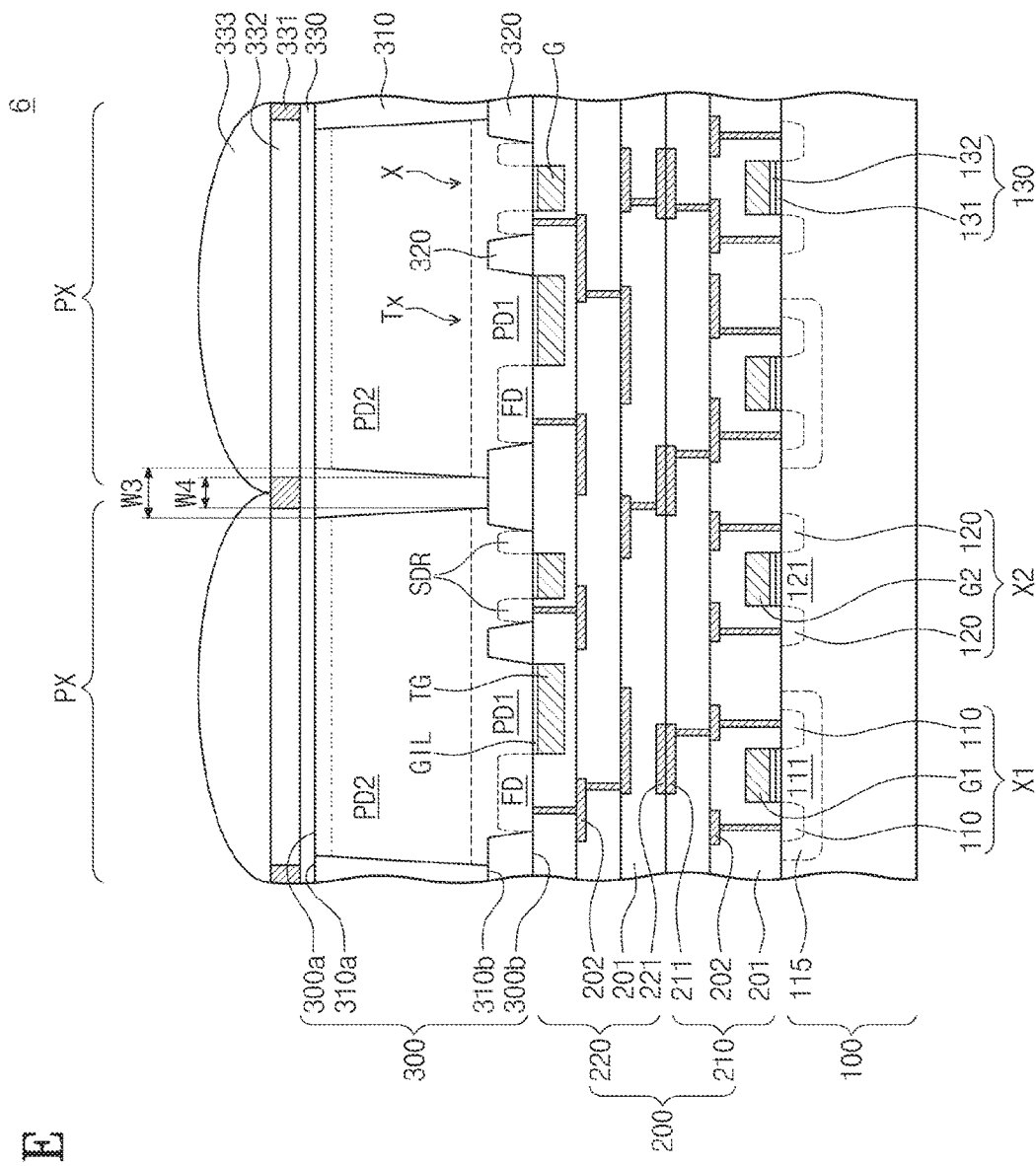

Referring to FIG. 9E, a buffer layer 330, a grid pattern 331, color filters 332, and micro lenses 333 may be formed on the first surface 300a of the upper substrate 300. An image sensor 6 may be manufactured by the manufacturing processes described above.

Figure 10:
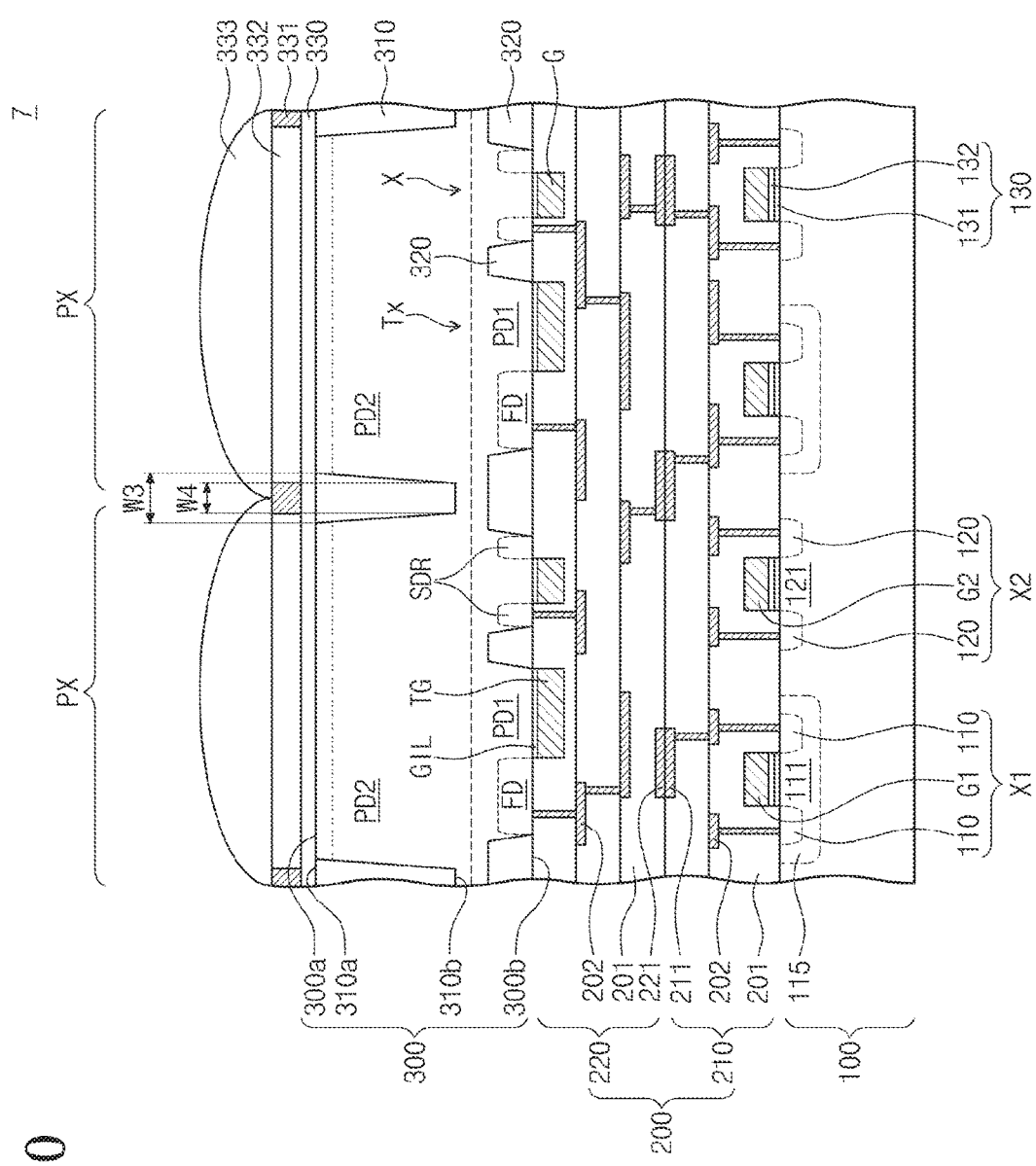
FIG. 10 is a cross-sectional view illustrating an image sensor according to some embodiments of the inventive concepts.

FIG. 10 is a cross-sectional view corresponding to a view taken along the line IV-V of FIG. 4A to illustrate an image sensor 7 according to some embodiments of the inventive concepts. Hereinafter, the descriptions to the same elements as mentioned above will be omitted or mentioned briefly for ease and convenience of explanation.

Referring to FIGS. 1, 2, 4A, and 10, an image sensor 7 may include a lower substrate 100, an interconnection layer 200, and an upper substrate 300. The lower substrate 100, the interconnection layer 200, and the upper substrate 300 may be the same as those described with reference to FIGS.

1, 4A, and 4B. The image sensor 7 may be manufactured using the same method as described with reference to FIGS. 9A to 9E. For example, the first device isolation pattern 310 may be formed using the processes described with reference to FIG. 9D. A width W3 of a top surface 310a of the first device isolation pattern 310 may be greater than a width W4 of a bottom surface 310b of the first device isolation pattern 310. However, the bottom surface 310b of the first device isolation pattern 310 may be spaced apart from the second device isolation pattern 320.

Image sensors according to embodiments of the inventive concepts may include a lower substrate and an upper substrate stacked on the lower substrate. The lower substrate may include logic transistors. A logic region may not be provided in the upper substrate, and thus a size (e.g., a planar area) of the image sensor may be reduced or minimized. Upper transistors of the upper substrate may have a second conductivity type. For example, a transistor of the first conductivity type may not be provided to the upper substrate. Thus, the processes of manufacturing the image sensors may be simplified. A gate insulating layer of the upper transistor may not include nitrogen. For example, a process of forming an additional nitride layer or a nitrogen injection process can be omitted to simplify the processes of manufacturing the image sensors.

While the inventive concepts have been described with reference to example embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. An image sensor comprising:
   a lower substrate including logic circuits;
   an interconnection layer provided on the lower substrate, the interconnection layer electrically connected to the logic circuits;
   an upper substrate provided on the interconnection layer, the upper substrate having pixels;
   a first device isolation pattern provided in the upper substrate; and
   a second device isolation pattern provided in the upper substrate,
   wherein the upper substrate has a first surface and a second surface opposite to each other, the first surface so configured that light comes through the first surface into the image sensor,
   wherein a combination of the first and second device isolation patterns penetrates the upper substrate from the first surface to the second surface,
   wherein all transistors provided on the upper substrate are the same conductivity type,
   wherein each of the transistors comprises:
   source/drain regions provided in the upper substrate;
   an upper gate electrode provided on the upper substrate; and
   a silicon oxide layer disposed between the upper substrate and the upper gate electrode, the silicon oxide layer being in contact with the upper substrate and the upper gate electrode,
   wherein the second device isolation pattern comprises a first part overlapping the first device isolation pattern in a plan view,
   wherein the second device isolation pattern comprises a second part disposed between two transistors in a plan view, the two transistors disposed in one pixel of the pixels,
   wherein depths of the first part and the second part of the second device isolation pattern in a perpendicular direction with respect to the first and second surfaces of the upper substrate are the same, and
   wherein the first part and the second part of the second device isolation pattern comprise the same material.

2. The image sensor of claim 1, wherein the silicon oxide layer does not include nitrogen.

3. The image sensor of claim 1, wherein the source/drain regions include N-type dopants.

4. The image sensor of claim 1, wherein the lower substrate comprises:
   source/drain portions provided in the lower substrate;
   a lower gate electrode provided on a channel region between the source/drain portions with respect to a plan view;
   a silicon oxide pattern disposed between the lower substrate and the lower gate electrode; and
   a silicon nitride pattern provided between the silicon oxide pattern and the lower gate electrode.

5. The image sensor of claim 4, wherein a conductivity type of dopants included in the upper gate electrode is the same as that of dopants included in the lower gate electrode, and
   wherein a silicon nitride layer is not provided between the upper substrate and the upper gate electrode.

6. The image sensor of claim 1, wherein the upper gate electrodes of the transistors include a transfer gate electrode, a source follower gate electrode, a selection gate electrode, and a reset gate electrode.

7. The image sensor of claim 1, wherein the first device isolation pattern defines the pixels; and
   wherein the second device isolation pattern defines an active region in which the source/drain regions are formed.

8. The image sensor of claim 7, wherein the second device isolation pattern is provided between the first device isolation pattern and the second surface of the upper substrate, wherein a sidewall of the second device isolation pattern is laterally offset from a sidewall of the first device isolation pattern.

9. The image sensor of claim 1, further comprising:
   a photoelectric conversion region provided in the upper substrate of each of the pixels;
   a floating diffusion region disposed in the upper substrate of each of the pixels, the floating diffusion region disposed adjacent to the second surface of the upper substrate;
   color filters disposed on the first surface of the upper substrate; and
   micro lenses disposed on the color filters.

10. The image sensor of claim 1, wherein the upper gate electrode includes dopants, and
    wherein the dopants include arsenic (As) but do not include boron (B).

11. The image sensor of claim 1, wherein the first device isolation pattern has a first surface coplanar with the first surface of the upper substrate and a second surface disposed opposite the first surface of the first device isolation pattern,
    wherein an area of the first surface of the first device isolation pattern is greater than an area of the second surface of the first device isolation pattern.

* * * * *